US012771340B2

(12) United States Patent
Gao et al.

(10) Patent No.: US 12,771,340 B2
(45) Date of Patent: Oct. 20, 2026

(54) DRIVING DEVICE OF SEMICONDUCTOR SWITCHING ELEMENT AND POWER CONVERSION DEVICE

(71) Applicant: HITACHI, LTD., Tokyo (JP)

(72) Inventors: Hangxian Gao, Tokyo (JP); So Watanabe, Tokyo (JP); Hiroshi Suzuki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 173 days.

(21) Appl. No.: 18/722,001

(22) PCT Filed: Oct. 21, 2022

(86) PCT No.: PCT/JP2022/039241
§ 371 (c)(1),
(2) Date: Jun. 20, 2024

(87) PCT Pub. No.: WO2023/135885
PCT Pub. Date: Jul. 20, 2023

(65) Prior Publication Data
US 2025/0070636 A1 Feb. 27, 2025

(30) Foreign Application Priority Data
Jan. 14, 2022 (JP) ................................ 2022-004593

(51) Int. Cl.
*H03K 17/16* (2006.01)
*H02M 1/08* (2006.01)

(52) U.S. Cl.
CPC ......... *H03K 17/168* (2013.01); *H03K 17/166* (2013.01); *H02M 1/08* (2013.01); *H03K 17/165* (2013.01)

(58) Field of Classification Search
CPC ....................... H03K 17/165-168; H02M 1/08
See application file for complete search history.

(56) References Cited

U.S. PATENT DOCUMENTS

2021/0013792 A1 1/2021 Matsubara et al.
2021/0143812 A1 5/2021 Matsubara
2022/0416782 A1* 12/2022 Akiyama ............ H03K 17/284

FOREIGN PATENT DOCUMENTS

JP 2021-013259 A 2/2021
JP 2021-078309 A 5/2021
JP 2021-141661 A 9/2021

OTHER PUBLICATIONS

Shu et al. Active Current Source IGBT Gate Drive With Closed-Loop di/dt and dv/dt Control, IEEE Trans. On Power Electronics, vol. 32, No. 5, May 2017 (Year: 2017).*

(Continued)

*Primary Examiner* — Jue Zhang
(74) *Attorney, Agent, or Firm* — MATTINGLY & MALUR, PC

(57) ABSTRACT

The present invention adjusts the surge voltage of a switching element to a prescribed value or lower while reducing switching loss in accordance with an operation condition. The present invention includes a gate driving circuit unit that drives a semiconductor switching element and a feedback current control unit that applies, to a gate G of the semiconductor switching element, a feedback current which is calculated by multiplying the change rate of electricity applied by the gate driving circuit unit to the semiconductor switching element by a prescribed gain, in which the change rate of electricity is the time change rate of the voltage and/or current applied to the semiconductor switching element; and the feedback current control unit adjusts the surge voltage of the semiconductor switching element by changing the gain in accordance with an operation condition of the semiconductor switching element.

20 Claims, 19 Drawing Sheets

(56) References Cited

OTHER PUBLICATIONS

Lu Shu et al., "Active Current Source IGBT Gate Drive With Closed-Loop di/dt and dv/dt Control", IEEE Transactions on Power Electronics, vol. 32, No. 5, May 2017.
International Search Report of PCT/JP2022/039241 dated Jan. 10, 2023.

* cited by examiner

DRIVING DEVICE OF SEMICONDUCTOR SWITCHING ELEMENT AND POWER CONVERSION DEVICE

TECHNICAL FIELD

The present invention relates to a driving device of a semiconductor switching element and a power conversion device.

BACKGROUND ART

A semiconductor switching element can interrupt an applied current by performing a switching operation and is used as an important component part of a power conversion device such as an arm switch of an inverter. For such a semiconductor switching element, switching loss at the switching time of ON/OFF poses a problem. It is necessary to drive the element at high speed to reduce switching loss. In this case, however, a surge voltage (turn-off surge voltage or recovery surge voltage) exceeding the withstand voltage of the element may occur and damage the element. As a technology for satisfying both suppression of the surge voltage of a semiconductor switching element and reduction in switching loss, therefore, an active gate drive system that changes gate driving conditions during switching has conventionally been known.

With regard to the aforesaid technology, Patent Literature 1 describes "a gate driving device provided with a driving circuit that drives a gate of a switching element to be connected between a high power supply potential unit and a low power supply potential unit in response to an input signal that commands ON/OFF of the switching element, a time memory circuit that memorizes a time period between switching of the input signal into an ON command and detection of a recovery surge voltage generated by a diode facing with the switching element, a switching determination circuit that determines whether or not gate driving conditions of the switching element are switched according to a detected value of a power supply voltage between the high power supply potential unit and the low power supply potential unit, and a driving condition changing circuit that changes, during current turn-on, the gate driving conditions for a time same as the time during previous turn-on memorized in the time memory circuit according to the determination results of the switching determination circuit."

A driving system disclosed in Patent Literature 2 is similar to that of Patent Literature 1 and is an active gate driving system for suppressing a turn-off surge. Patent Literature 2 describes "a gate driving device provided with a driving circuit that drives a gate of a switching element to be connected between a high power supply potential unit and a low power supply potential unit according to an input signal that commands ON/OFF of the switching element, an off surge detector circuit that detects an off-surge generated in the switching element, a time memory circuit that memorizes a time width between switching of the input signal into an OFF command and detection of the off surge, a switching determination circuit that determines whether or not gate driving conditions of the switching element are switched according to a detected value of a power supply voltage between the high power supply potential unit and the lower power supply potential unit, and a driving condition changing circuit that changes the gate driving conditions during current turn-off, after a lapse of the time width during previous turn-off memorized in the time memory circuit, according to the determination results of the switching determination circuit."

In addition, Nonpatent Literature 1 discloses an active gate driving system that forms a feedback current based on a main current or a main voltage during switching and feeds back the feedback current to a gate current of a switching element, thereby changing a switching speed.

CITATION LIST

Patent Literature

Patent Literature 1: Japanese Unexamined Patent Application Publication No. 2021-078309

Patent Literature 2: Japanese Unexamined Patent Application Publication No. 2021-013259

Nonpatent Literature

Nonpatent Literature 1: Shu, L., Zhang, J., Peng, F. & Chen, Z., "Active current source IGBT gate drive with closed-loop di/dt and dv/dt control", IEEE TRANSACTIONS ON POWER ELECTRONICS, VOL. sc-32, NO. 5, May 2017

SUMMARY OF INVENTION

Technical Problem

The surge voltage of a switching element changes depending on the operation conditions of the switching element. The operation conditions here include a voltage supplied from a DC power source (which will hereinafter be called "bus voltage", main currents running through a switching element (such as a drain current and a source current of MOSFET or a collector current and an emitter current of IGBT), and a junction temperature of a switching current.

In determining the driving conditions of a gate in designing of a semiconductor switching element, a surge voltage is required to be designed not to exceed, under the worst operation conditions (conditions in which the surge voltage reaches the maximum value and which will be described in detail later), voltages (which will hereinafter be called "main voltage criteria") obtained by subtracting a predetermined margin from a rated voltage of the element. In the conventional active gate driving system (for example, that described in Nonpatent Literature 1), therefore, a proper amount of a feedback current to be applied to a gate is determined, a driving speed of the gate is slowed down, and the surge voltage is suppressed to main voltage criteria or less under the worst operation conditions. In the conventional active gate driving system, however, the control amount of the feedback current is fixed and it is difficult to adjust the gate current according to the operation conditions. Even in a region with a small surge voltage, therefore, the control amount of a feedback current is still as high as that in the worst operation conditions and it may excessively slow down the driving speed of a gate and increase the switching loss.

In addition, in Patent Literature 1 and Patent Literature 2, although the driving conditions of a gate prepared in advance can selectively be changed according to the bus voltage or temperature, the number of selectable driving conditions is limited so that only a stepwise change can be achieved. Some operation conditions therefore may not allow an adequate reduction in switching loss. A reduction in switching loss can be achieved by increasing the number of selectable driving conditions and finely changing the driving conditions according to the operation conditions, but in this case, the number of circuits increases, causing a problem of an increased size or cost of the driving device.

Solution to Problem

With the aforesaid problems in view, a driving device of a semiconductor switching element according to the present invention has a gate driving circuit unit that drives a semiconductor switching element and a feedback current control unit that applies, to a gate of the semiconductor switching element, a feedback current calculated by multiplying a change rate of electricity to be applied by the gate driving circuit unit to the semiconductor switching element by a predetermined gain, in which the change rate of electricity is a time change rate of at least one of a voltage or a current to be applied to the semiconductor switching element and the feedback current control unit adjusts a surge voltage of the semiconductor switching element by changing the gain according to the operation conditions of the semiconductor switching element.

A power conversion device according to the present invention has the aforesaid driving device of semiconductor switching elements and a plurality of semiconductor switching elements.

Advantageous Effects of Invention

According to the present invention, it is possible to reduce switching loss according to the operation conditions while adjusting the surge voltage of the semiconductor switching element to a specified value or less.

Further features related to the present invention will be apparent from the description herein and attached drawings. Problems, structures, and advantages other than those described above will be apparent from the description of the following Examples.

DETAILED DESCRIPTION

First Embodiment

Figure 1:
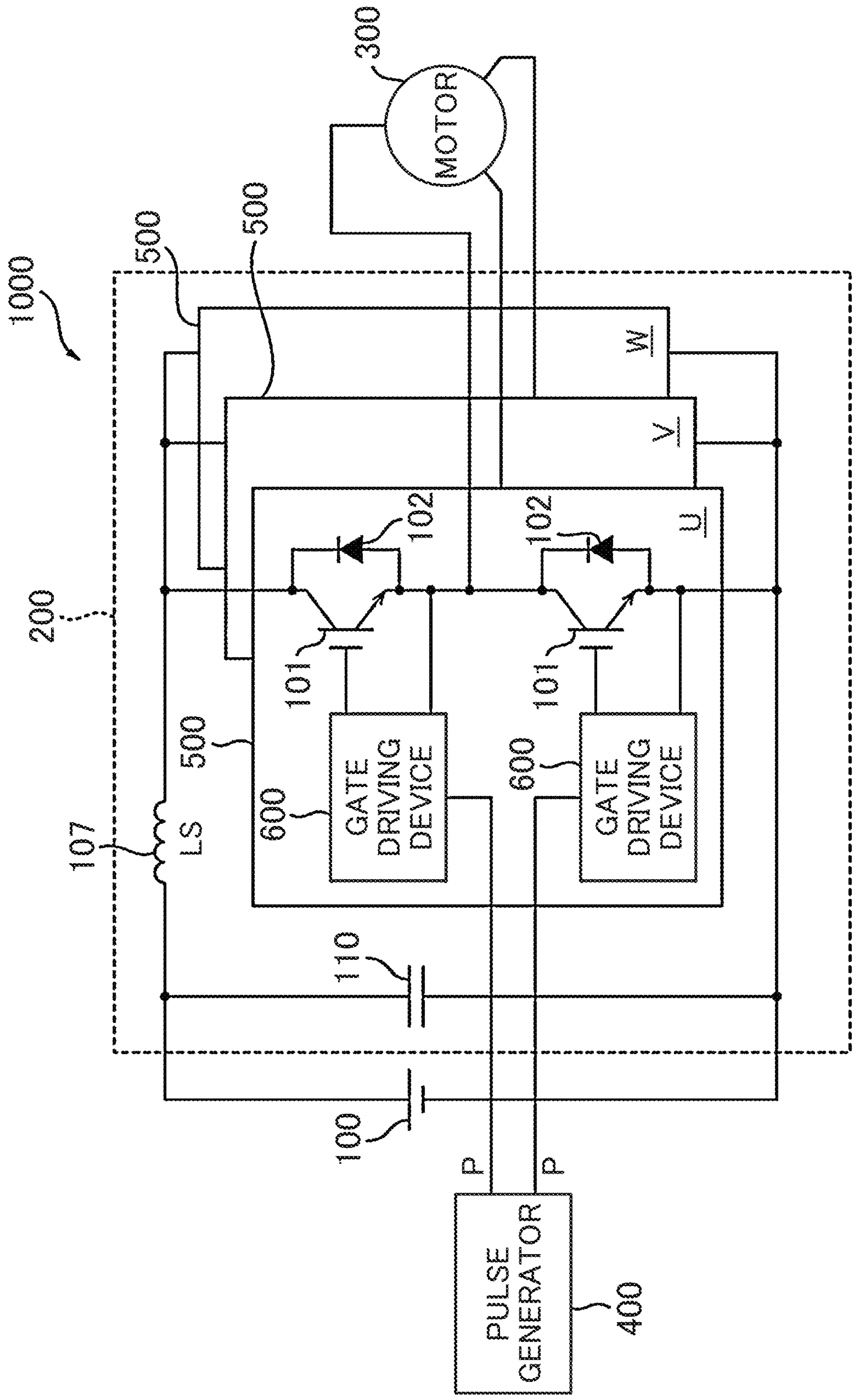
FIG. 1 is a block diagram showing one example of an electric motor control system to which the present invention is applied.

FIG. 1 is a block diagram showing one example of an electric motor control system to which the present invention is applied. A description herein will be made with a system for vehicles as an example, but the system may be used for other purposes. As shown in FIG. 1, an electric motor control system 1000 has a pulse generator 400, a battery 100, an inverter circuit 200, and an electric motor 300. The inverter circuit 200 converts DC power supplied from the battery 100 to AC for driving the electric motor 300.

The inverter circuit 200 is equipped with a smoothing capacitor 110 and a three-phase switching arm (phase U 500, phase V 500, and phase W 500). The smoothing capacitor 110 and the three-phase switching arm have therebetween a main circuit parasitic inductance 107. Between the battery 100 and the three-phase switching arm, the smoothing capacitor 110 is connected in parallel. Upper and lower arms of one of the three phases, for example, the phase U 500 each have a semiconductor switching element 101, a freewheeling element 102, and a gate driving device 600. The phase V 500 and the phase W 500 also have a similar constitution.

The semiconductor switching element 101 is composed of, for example, IGBT (Insulated Gate Bipolar Transistor). It may also be composed of a voltage driven semiconductor switching element such as MOSFET. A semiconductor constituting the semiconductor switching element 101 may be either silicon (Si) or a wide gap semiconductor (such as silicon carbide (SiC), gallium nitride (GaN), or gallium oxide ($Ga_2O_3$)). The freewheeling element 102 is composed of, for example, a diode. As the diode, usable are various diodes such as a pn junction diode, a Schottky barrier diode, and a diode using pn junction and Schottky junction in combination. When the semiconductor switching element 101 is SiC-MOSFET, the freewheeling element 102 may be loaded in the semiconductor switching element 101 as an SiC-MOSFET body diode. The following description will be made with IGBT as an example of the semiconductor switching element 101. The IGBT has a collector C as a high-potential-side terminal, an emitter E as a low-potential-side terminal, and a gate G as an input terminal.

One IGBT 101 and one diode 102 constitute one power element. The diode is connected in reversely parallel to IGBT. The upper arm power element and the lower arm power element of each phase are connected in series. To the high-potential-side terminal of the upper arm power element in each phase, the positive electrode of the smoothing capacitor 110 is connected. To the low-potential-terminal side of the lower arm power element in each phase, the negative electrode of the smoothing capacitor 110 is connected. In each phase, the common connection point between the low-potential-side terminal of the upper arm power element and the high-potential-side terminal of the lower arm power element is connected to a stator winding (not shown) of the electric motor 300.

The pulse generator 400 inputs a signal into the gate terminal of the semiconductor switching element 101 via the gate driving device 600 and thereby controls switching. The pulse generator 400 inputs an on-command signal (a command signal P is at high potential) or an off-command signal (a command signal P is at low potential) into the gate driving device 600. The gate driving device 600 turns the semiconductor switching element 101 ON or OFF in response to the command signal P. This switches the respective semiconductor switching elements 101 of the upper and lower arms alternately and thereby controls AC power flowing to the electric motor 300.

Example 1

Figure 2:
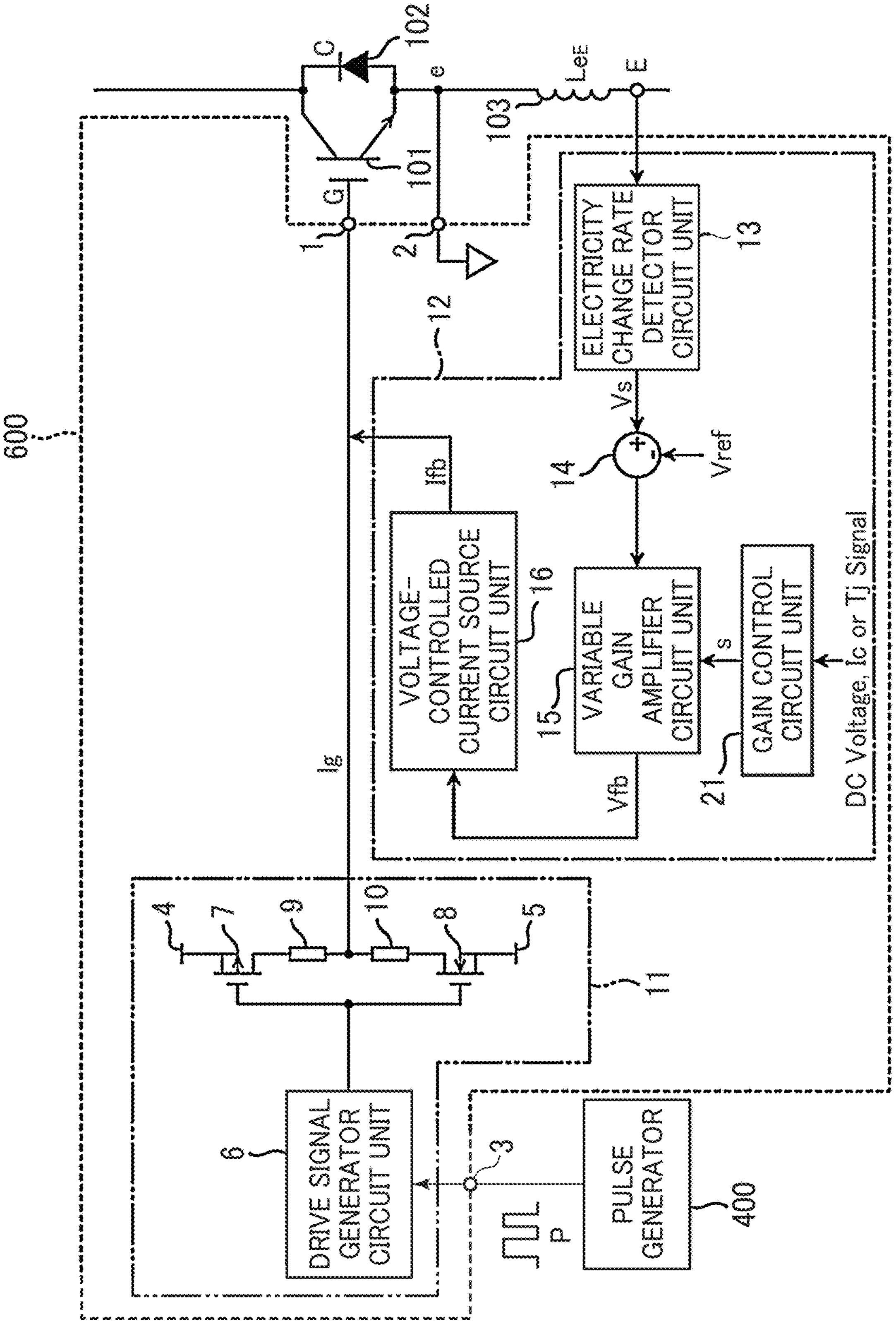
FIG. 2 is a block diagram of a basic circuit of a gate driving device of Example 1.
Figure 3:
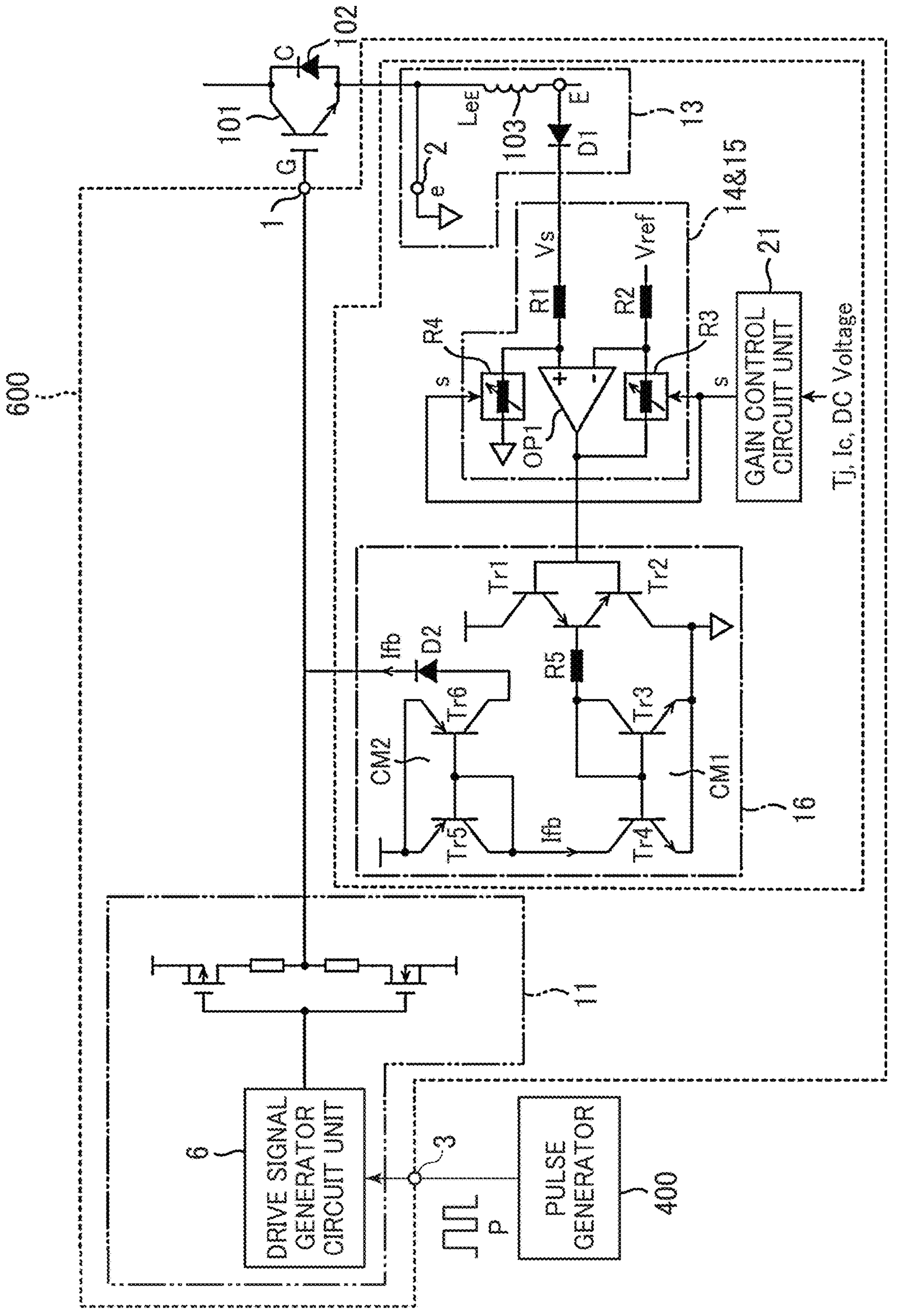
FIG. 3 shows one example of a circuit constitution of the gate driving device of Example 1.
Figure 4:
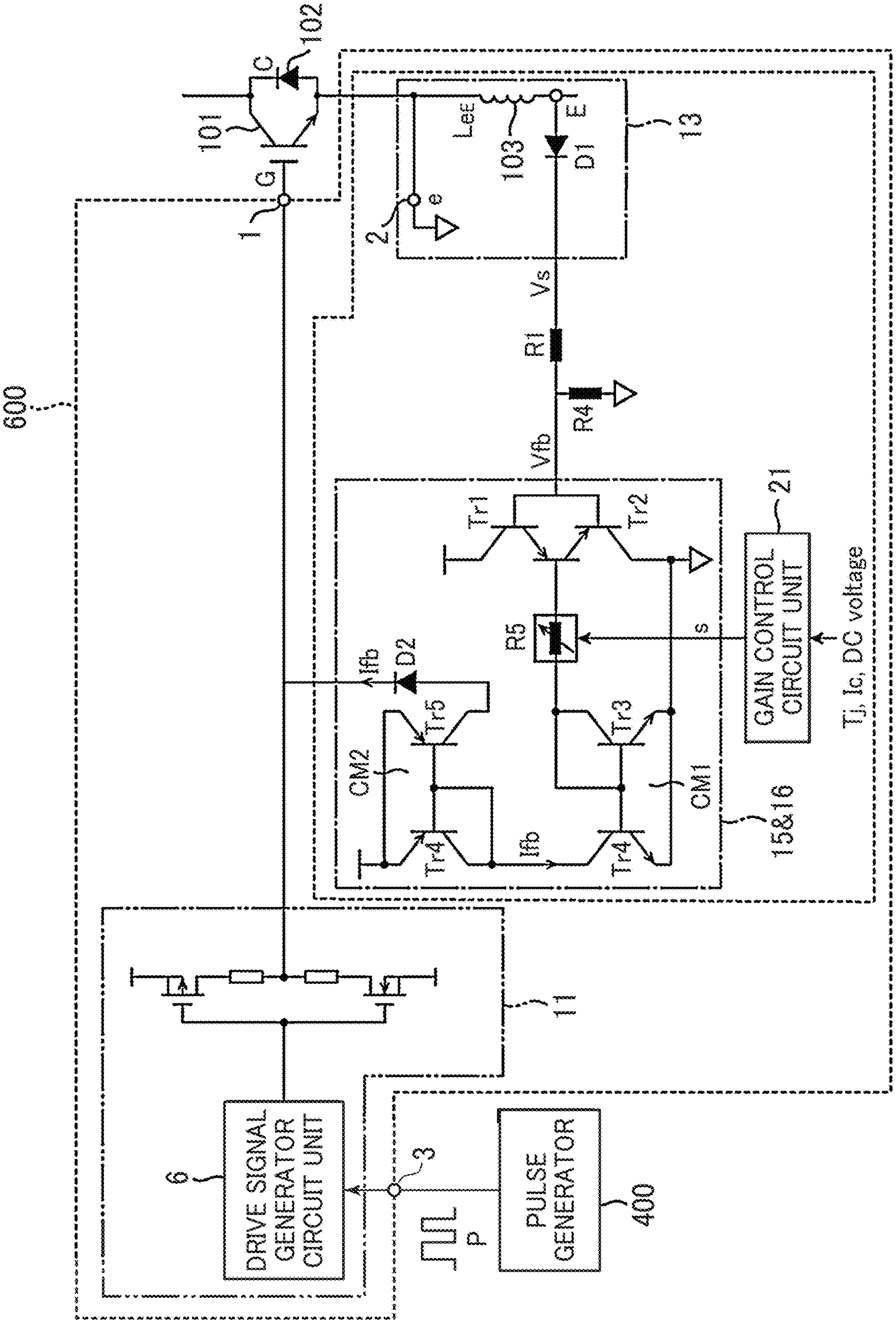
FIG. 4 shows another example of a circuit constitution of the gate driving device of Example 1.

FIG. 2 is a block diagram of a basic circuit of the gate driving device 600 of Example 1 of the present invention, while FIGS. 3 and 4 are views showing an example of a more specific circuit constitution of the gate driving device 600 of Example 1. In FIGS. 2 to 4, components identified by the same reference number have the same constitution or a constitution having a similar function. The gate driving device 600 of Example 1 will hereinafter be described based on FIGS. 2 and 4.

FIG. 2 shows, in the inverter circuit 200, a semiconductor switching element 101 of a lower arm of a phase U 500 and a gate driving device 600 therefor. It is to be noted that the constitution and the operation of the respective semiconductor switching elements of the upper arm of the phase U and the upper and lower arms of the phases V and W are the same as those shown above.

The gate driving device 600 has a gate driving circuit unit 11 and a feedback current control unit 12. The gate driving circuit unit 11 is equipped with a drive signal generator circuit unit 6, a positive side power source 4, a first MOSFET 7, an on-side gate resistor 9, a negative side power source 5, a second MOSFET 8, and an off-side gate resistor 10. The feedback current control unit 12 is equipped with an electricity change rate detector circuit unit 13, a subtractor 14, a variable gain amplifier circuit unit 15, a voltage-controlled current source circuit unit 16, and a gain control circuit unit 21. The gate driving circuit unit 11 may have a constitution of a current source driving circuit. The electricity change rate detector circuit unit 13 may include a power semiconductor module or a portion of the inverter (for example, the emitter-side parasitic inductance $L_{eE}$ in FIG. 2), which will be described later.

An input terminal 3 of the gate driving device 600 is connected to the pulse generator 400. An output unit 1 of the gate driving device 600 is connected to the gate terminal of the semiconductor switching element 101. A reference potential 2 of the gate driving device 600 is connected to a Kelvin emitter e of the semiconductor switching element 101.

In the gate driving circuit unit 11, a source of the Pch type first MOSFET 7 is connected to the positive side power source 4. One end of the on-side gate resistor 9 is connected to the drain of the first MOSFET 7. One end of the off-side gate resistor 10 is connected to the other end of the on-side gate resistor 9. The drain of the Nch type second MOSFET 8 is connected to the other end of the off-side gate resistor 10. The source of the second MOSFET 8 is connected to the negative-side power source. The gate of the first MOSFET 7 and the gate of the second MOSFET 8 are both connected to the drive signal generator circuit unit 6. An intermediate connection point between the on-side gate resistor and the off-side gate resistor is connected to the output unit 1 of the gate driving device 600.

In the feedback current control unit 12, the electricity change rate detector circuit unit 13 is connected to the subtractor 14. The output terminal of the subtractor 14 is connected to the variable gain amplifier circuit unit 15 to output a difference between the output voltage Vs of the electricity change rate detector circuit unit 13 and the referential voltage Vref. The gain control circuit unit 21 outputs a control signal s depending on the operation conditions of the semiconductor switching element to the control terminal of the variable gain amplifier circuit unit 15. The output terminal of the variable gain amplifier circuit unit 15 is connected to the input terminal of the voltage-controlled current source circuit unit 16. Then, the variable gain amplifier circuit unit 15 calculates a voltage signal Vfb by multiplying a difference between the output voltage Vs and the reference voltage Vref by a gain that depends on the value of the received control signal s. The output terminal of the voltage-controlled current source circuit unit 16 is connected to the output unit 1 of the gate driving device 600. After conversion of the voltage signal Vfb into a feedback current Ifb, it is output to the gate G of the semiconductor switching element 101.

The operation of the gate driving circuit unit 11 will next be described. First, a command signal P from the pulse generator 400 is input into the gate driving device 600. During the term in which the command signal P is at a high potential (ON), the drive signal generator circuit unit 6 operates to turn the first MOSFET 7 ON and the second MOSFET 8 OFF. By this operation, a gate current Ig flows to the gate G of the semiconductor switching element 101 from the positive side power source 4 through the on-side gate resistor 9 and is charged until the gate-emitter capacitance reaches the voltage (for example, +15V) of the positive side power source 4. When the gate voltage increases to exceed the threshold voltage (for example, 6.5V) at this time, the semiconductor switching element 101 turns ON and a collector-emitter current flows.

By adjusting the resistance value of the on-side gate resistor 9 or the voltage value of the positive side power source 4, a turn-on switching speed can be controlled. On the other hand, during the term in which the drive command signal P is at a low potential, the drive signal generator circuit unit 6 operates to turn the first MOSFET 7 OFF and the second MOSFET 8 ON. By this operation, a current flows from the gate G of the semiconductor switching element 101 to the negative side power source 5 via the off-side gate resistor 10. The voltage value of the negative side power source 5 is set at, for example, 0V which is equal to a reference potential. The gate-emitter capacitance of the semiconductor switching element 101 is discharged and the gate voltage drops below the threshold voltage. The semiconductor switching element 101 turns OFF and a collector-emitter current stops. By adjusting the resistance value of the off-side gate resistor 10 or the voltage value of the negative side power source 5, the turn-on switching speed can be controlled.

Next, the fundamental operation of the feedback current control unit 12 will be described. The description will be made with the operation during turn-off of the semiconductor switching element 101 as an example. This will be similarly applied to the operation during turn-on. When the main current Ic of the semiconductor switching element 101 changes during turn-off, a variation voltage $V_{eE}$ appears between Kelvin emitter e and emitter E on the emitter-side parasitic inductance $L_{eE}$ 103. The variation voltage $V_{eE}$ is represented by the following Equation 1.

$$V_{eE} = -L_{eE} \times dIc/dt \quad \text{Equation 1}$$

In the above equation, dIc/dt represents a time change rate of the main current Ic (negative during turn-off). The electricity change rate detector circuit unit 13 detects a variation voltage $V_{eE}$ and after rectification, inputs it into the subtractor 14 as a detection signal (output voltage) Vs. The relation between the detection signal Vs and the variation voltage $V_{eE}$ during turn-off can be represented by the following Equation 2.

$$Vs = V_{eE} \quad \text{Equation 2}$$

The subtractor 14 compares the received detection signal Vs with the reference voltage Vref and inputs a differential voltage into the variable gain amplifier circuit unit 15.

Into the gain control circuit unit 21, a sensing value of any of the bus voltage (VDC), temperature (Tj), and main current (Ic) of the semiconductor switching element 101 is input. The gain control circuit unit 21 forms a gain control signal s based on the aforesaid sensing value of the semiconductor switching element 101 and outputs it into the control terminal of the variable gain amplifier circuit unit 15. The variable gain amplifier circuit unit 15 changes the gain according to the control signal s. The variable gain amplifier circuit unit 15 amplifies by multiplying a differential voltage between Vs and Vref input from the subtractor 14 by the gain and forms a voltage signal Vfb.

The voltage signal Vfb is input into the voltage-controlled current source circuit unit 16. The voltage-controlled current source circuit unit 16 converts the voltage signal Vfb into a feedback current Ifb and feeds it back to the output unit 1 of the gate driving device 600. The feedback current Ifb can be represented by the following Equation 3.

$$Ifb = G(s) \times g \times (Vs - Vref) \quad \text{Equation 3}$$

In the above equation, G(s) is a voltage gain of the variable gain amplifier circuit unit 15 and g is an amplification factor of the voltage-controlled current source circuit unit 16. Vref is a reference voltage. The value of Vref is, for example, 0. G(s) can be adjusted according to the gain control signal s. g is a fixed value. It is to be noted that as shown later in FIG. 4, the amplification factor g may be replaced by g(s) that depends on s or the voltage gain G(s) may be replaced by a fixed value G.

Here, sensing of the operation conditions of the semiconductor switching element 101 will be described. The bus voltage (VDC) can be obtained, for example, from a voltage sensor to be connected to both ends of the smoothing capacitor 110. It can also be obtained by measuring the voltage of the semiconductor switching element 101 during the off term by means of a voltage sensor connected to between collector and emitter of the semiconductor switching element 101. The main current (Ic) of the semiconductor switching element 101 can be obtained, for example, by inserting a current sensor such as HALL element into the output of the phase U, V, or W shown in FIG. 1. The junction temperature (Tj) of the semiconductor switching element 101 can be obtained, for example, using a temperature sensor such as built-in thermosensitive diode which is omitted from the drawing.

As is apparent from Equations 1 to 3, the feedback current Ifb is proportional to the time change rate dIc/dt of the main current of the semiconductor switching element 101 so that the larger the absolute value of the time change rate, the larger the feedback current Ifb.

Here, the relation between a turn-off surge voltage and a time change rate of main current can be represented by the following equation.

$$Vsurge = -Ls \times dIc/dt + VDC \quad \text{Equation 4}$$

In the above equation, Vsurge is a surge voltage and Ls is a parasitic inductance (for example, a main current parasitic inductance 107 shown in FIG. 1). As shown in Equation 4, the surge voltage and the time change rate of main current are proportional and with an increase in the surge voltage, the absolute value of the feedback current Ifb increases. G(s) or g is set so that the gate current Ig of the semiconductor switching element 101 during turn-off is negative (meaning a direction of withdrawing a charge from a gate), while the feedback current Ifb is positive (meaning a direction of injecting a charge in a gate). In such a manner, the absolute value of the gate current Ig can be made smaller during the feedback current Ifb flowing term.

As a result, the switching speed of the semiconductor switching element 101 is reduced and the surge voltage of the semiconductor switching element 101 during turn-off is suppressed. The feedback current Ifb can be adjusted flexibly by changing the gain G(s) according to the operation conditions of the semiconductor switching element 101. This makes it possible to increase the switching speed of the semiconductor switching element 101 while adjusting the surge voltage value during turn-off so as not to exceed the withstand voltage of the element according to the operation conditions. Accordingly, both the suppression of the surge voltage and reduction in switching loss can be satisfied.

Here, the description is made with the turn-off time as an example, but similarly during turn-on, by setting the rectification system, the voltage gain G(s), and the amplification factor g so that the feedback current Ifb flows in a direction opposite to the gate current Ig, it is possible to decrease the turn-on speed, adjust the suppression amount of a recovery surge voltage generated at a paired arm (an upper arm when turned-on with a lower arm), and reduce the switching loss. This will also apply to a modification example or another embodiment which will be described later.

The variable gain amplifier circuit unit 15 is a circuit using, as one example in the present Example, a voltage-controlled amplifier (VCA) capable of continuously changing a gain according to an input voltage. It may also be a variable amplifier that changes an amplification factor of an operational amplifier by using a light-dependent resistor (LDR) or a variable amplifier having a transconductance amplifier (OTA).

The feedback current control unit 12 may have a constitution that omits the subtractor 14. In this case, the electricity change rate detector circuit unit 13 is connected directly to the variable gain amplifier circuit unit 15. The subtractor 14 and the variable gain amplifier circuit unit 15 may be integrated into one. The constitution may be such that it integrates the variable gain amplifier circuit unit 15 with the voltage-controlled current source circuit unit 16.

FIGS. 3 and 4 are views showing a specific example of the circuit constitution of the gate driving device 600 of the first embodiment and they show a circuit that controls the turn-off of the semiconductor switching element 101. FIGS. 3 and 4 show a circuit example mainly showing a specified constitution of the electricity change rate detector circuit unit 13, the subtractor 14, the variable gain amplifier circuit unit 15, and the voltage-controlled current source circuit unit 16 in the feedback current control unit 12.

As shown in FIG. 3, the electricity change rate detector circuit unit 13 has a rectifier diode D1 and an emitter-side parasitic inductance 103. The subtractor 14 and the variable gain amplifier circuit unit 15 are integrated into one and are constituted by operational amplifier differential amplifier circuits 14 & 15. The operational amplifier differential amplifier circuits 14 & 15 are equipped with an operational amplifier OP1, voltage dividing resistors R1 and R2, and voltage-controlled resistors (VCR) R3 and R4. The voltage-controlled current source circuit unit 16 is equipped with a current buffer circuit having transistors Tr1 and Tr2, a current mirror circuit having Tr3, Tr4, Tr5, and Tr6, a voltage regulator resistor R5, and a rectifier diode D2.

The anode of the rectifier diode D1 in the electricity change rate detector circuit unit 13 is connected to an emitter E and the cathode is connected to the resistor R1. The varied voltage $V_{eE}$ detected at the emitter E is rectified by the rectifier diode D1, blocks a negative voltage, and applies a positive output voltage Vs to the resistor R1.

The operational amplifier differential amplifier circuits 14 & 15 are circuits that forms a drive voltage of the voltage-controlled current source circuit unit 16. In the operational amplifier OP1, a non-inverting input terminal is connected to a node between the resistor R1 and the voltage-controlled resistor R4, that is, connected to the electricity change rate detector circuit unit 13. To an inverting input terminal, a node between the resistor R2 and the voltage-controlled resistor R3, that is, a referential voltage Vref is applied. The output of the operational amplifier differential amplifier circuits 14 & 15 is connected to the gate of the transistors Tr1 and Tr2. The operational amplifier differential amplifier circuits 14 & 15 amplify a difference between the referential voltage Vref and the detected output voltage Vs, forms a feedback voltage Vfb, and applies it to the transistors Tr1 and Tr2.

In the voltage-controlled current source circuit unit 16, the transistors Tr1 and Tr2 are connected in series between the positive side power source 4 (refer to FIG. 2) and the reference potential 2. In the present embodiment, the transistor Tr1 is an NPN BJT (Bipolar Junction Transistor) and the transistor T2 is a PNP BJT. Into the gate of the transistors Tr1 and Tr2, a feedback voltage Vfb is input. The node between the transistors Tr1 and Tr2 is connected to one end of the resistor R5. The transistors Tr3 and Tr4 constitute a current mirror CM1. The other end of the resistor R5 is connected to the input terminal of the current mirror CM1.

The current mirror CM1 is placed between the resistor R5 and the reference potential 2. Therefore, a feedback current Ifb according to the feedback voltage Vfb flows from the intermediate point of the transistors Tr1 and Tr2 toward the input terminal of the current mirror CMI via the resistor R5. Further, the transistors Tr5 and Tr6 constitute a current mirror CM2. The current mirror CM2 is placed between the current mirror CM1 and the positive side power source 4.

The input terminal of the current mirror CM2 is connected to the output terminal of the current mirror CM1. The feedback current Ifb is copied at the current mirror CM1 and is caused to flow from the input terminal of the current mirror CM2 to the output terminal of the current mirror CM1. The output terminal of the current mirror CM2 is connected to the gate of the semiconductor switching element 101 via the rectifier diode D2. By this constitution, the feedback current Ifb is copied again and injected into the gate G of the semiconductor switching element 101.

Here, the resistor R1 and the resistor R2 may be set at the same resistance value and the voltage-controlled resistor R3 and the voltage-controlled resistor R4 may be set at the same resistance value. Since the on-voltage of the rectifier diode and transistor is small, the influence of it is omitted and the feedback current Ifb in the present circuit example may be represented by the following equation.

$$Ifb = R4 \times (Vs - Vref)/(R1 \times R5) \quad \text{Equation 5}$$

In the above equation, R4/R1 is a gain of the variable gain amplifier circuit unit 15, that is, G(s) of Equation 3. 1/R5 is an amplification factor of the voltage-controlled current source circuit unit 16, that is, g of Equation 3. Vref is a referential voltage and is, for example, 0. The resistance value of the voltage-controlled resistor R4 can be changed according to a voltage control signal s. Since the voltage control signal s can be determined based on the operation conditions of the semiconductor switching element, the feedback current Ifb can be adjusted according to the operation conditions of the semiconductor switching element 101. This makes it possible to reduce switching loss while adjusting the suppression amount of the surge voltage according to the operation conditions of the semiconductor switching element 101.

The voltage-controlled resistor R4 may be a field effect transistor that changes a resistance value according to a voltage control signal to be input into a control terminal. The field effect transistor may be either JFET (junction FET) or MOSFET. The voltage-controlled resistor may be a circuit using, in combination, the field effect transistor and a resistor connected thereto in parallel or in series. Here, R4 is described as a voltage-controlled resistor, but R1 or R2 may be a voltage-controlled resistor.

FIG. 4 is a view showing another example of a circuit constitution of the gate driving device 600 of Example 1.

The constitution same as that of the circuit shown in FIG. 3 is identified by the same reference numeral and a description on it is omitted.

In the constitution shown in FIG. 4, the subtractor 14 is omitted. In addition, the variable gain amplifier circuit unit 15 and the voltage-controlled current source circuit unit 16 are integrated into one and are constituted as variable gain voltage-controlled current source circuit units 15 & 16. The electricity change rate detector circuit unit 13 is connected to the variable gain voltage-controlled current source circuit units 15 & 16 via a voltage divider circuit composed of the resistors R1 and R4. In the present circuit example, R1 and R4 are fixed resistors and R5 is a voltage-controlled resistor. The feedback current Ifb in this example can be represented by the following equation.

$$Ifb = R4 \times Vs/((R1 + R4) \times R5) \quad \text{Equation 6}$$

In the above equation, R4/(R1+R4) is a partial pressure of a voltage divider circuit and obtained by setting a voltage gain in Equation 3 as a fixed value G. 1/R5 is an amplification factor of the voltage-controlled current source circuit unit 16. Since the resistance value of the voltage-controlled resistor R5 can be changed according to the voltage control signal s, 1/R5 is obtained by setting the amplification factor of Equation 3 as g(s) that depends on the voltage control signal s. Also by this circuit example, the feedback current Ifb can be adjusted flexibly according to the voltage control signal s. This makes it possible to reduce switching loss while adjusting the suppression amount of the surge voltage according to the operation conditions of the semiconductor switching element 101.

Figure 5:
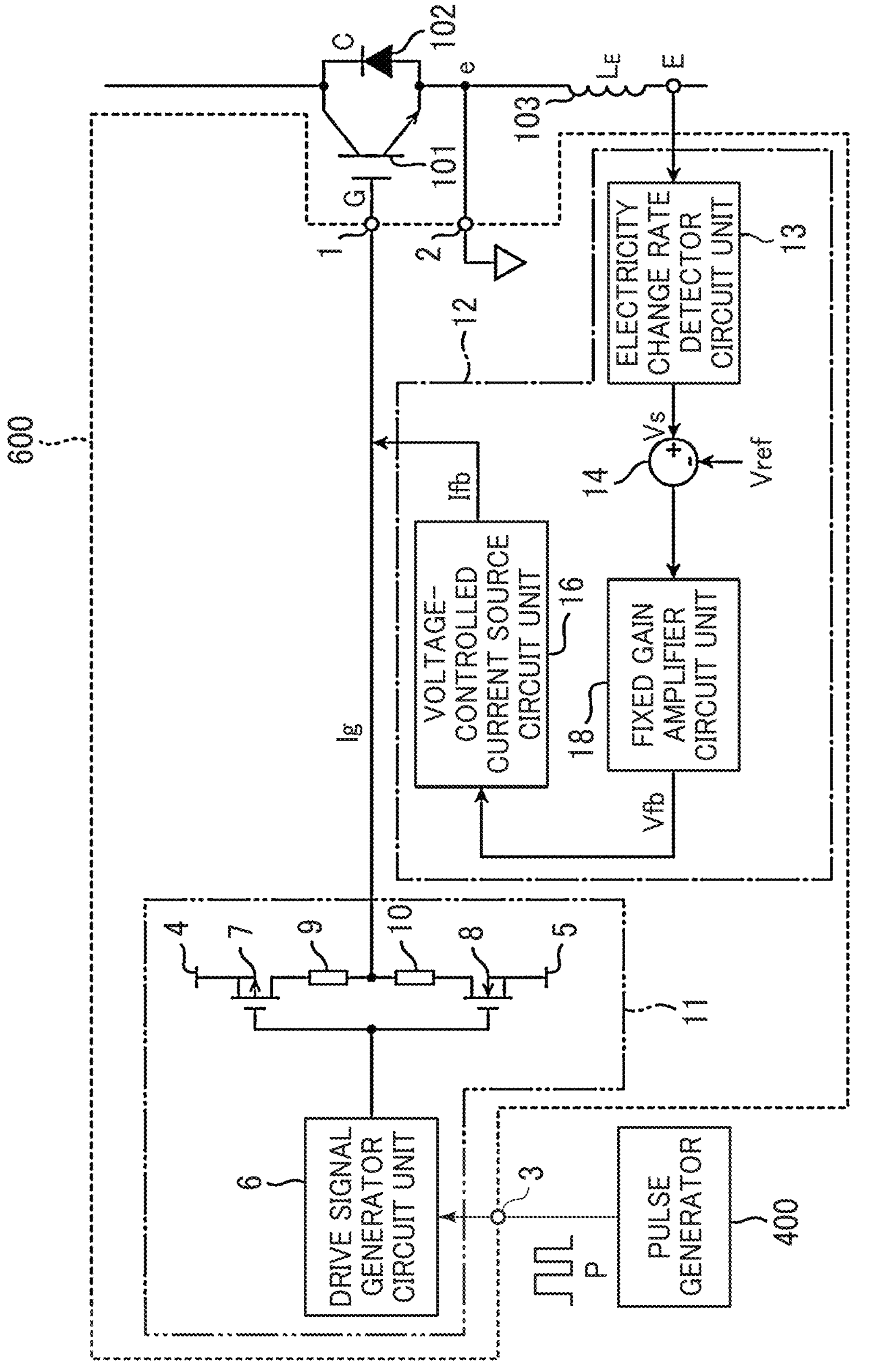
FIG. 5 is a block diagram of a basic circuit of a gate driving device of Conventional Example 1.

FIG. 5 is a block diagram of a basic circuit of a gate driving device 600 of Conventional Example 1. Conventional Example 1 is an example obtained by partially modifying the constitution described in Nonpatent Literature 1 to facilitate comparison with the gate driving device 600 of Example of the present invention. The gate driving device 600 of Conventional Example 1 is similar to the gate driving device 600 of Example shown in FIG. 2 except that the gain control circuit unit 21 is removed and the variable gain amplifier circuit unit 15 is replaced by a fixed gain amplifier circuit unit 18.

With reference to the circuit example of the present Example, a feedback current Ifb to be output from a feedback current control unit 12 of Conventional Example 1 is represented by the following equation.

$$Ifb = G \times g \times (Vs - Vref) \quad \text{Equation 7}$$

In the above equation, G is a voltage gain of the fixed gain amplifier circuit unit 18 and g is an amplification factor of a voltage-controlled current source circuit unit 16. Vref is a referential voltage (voltage value is set, for example, at 0). G and g are each a fixed value. Also in the feedback current Ifb represented by Equation 7, the voltage gain G and the amplification factor g are set so as to make the absolute value of the gate current Ig smaller as in the present Example. This makes it possible to reduce the switching speed of the semiconductor switching element 101 and suppress the surge voltage of the semiconductor switching element 101. In Conventional Example 1, however, the voltage gain G and the amplification factor g are both a fixed value so that the value of the feedback current Ifb cannot be adjusted. The suppression amount of the surge voltage therefore cannot be adjusted according to the operation conditions of the semiconductor switching element 101.

Figure 6:
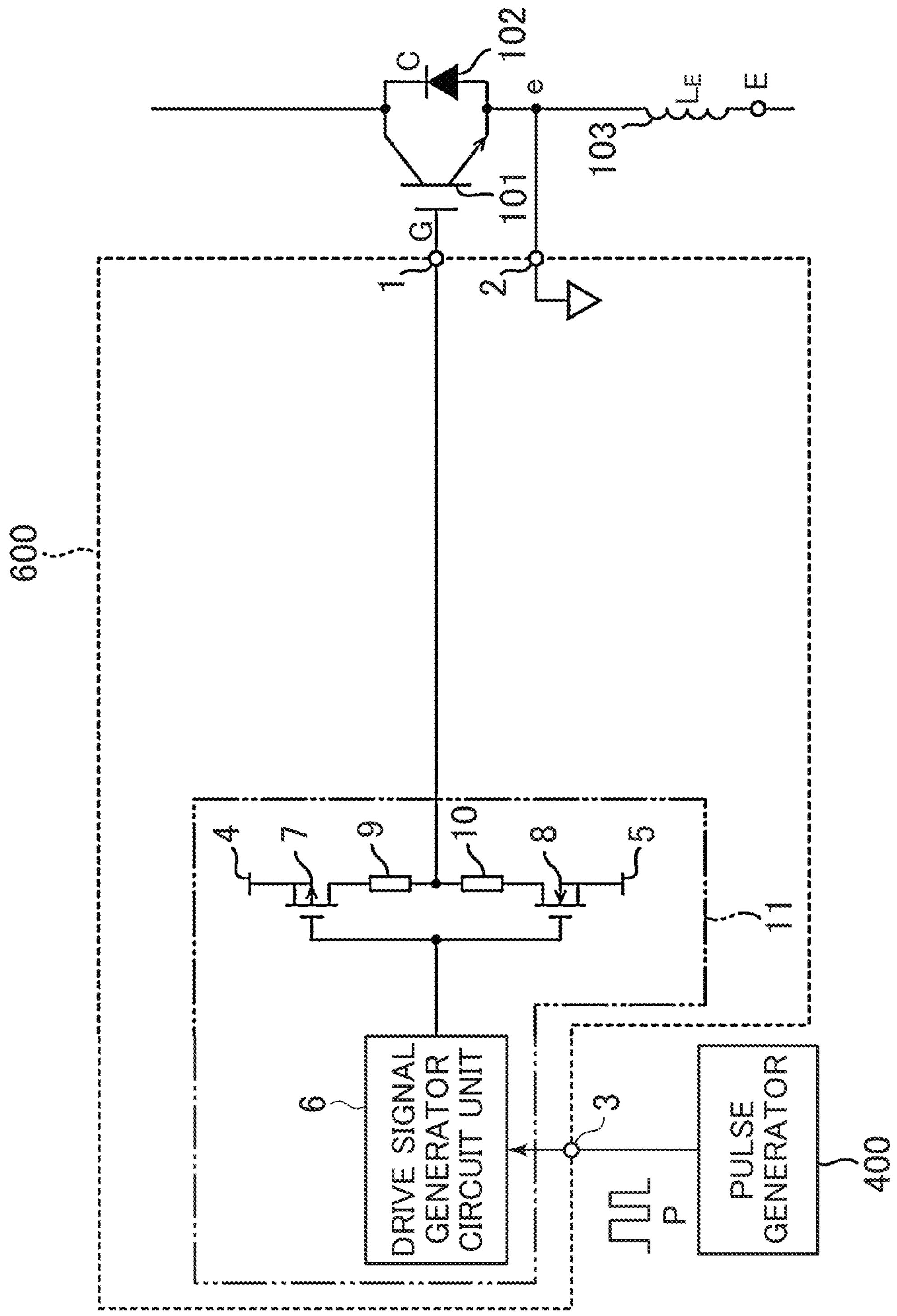
FIG. 6 is a block diagram of a basic circuit of a gate driving device of Conventional Example 2.

FIG. 6 is a circuit diagram of a gate driving device 600 of Conventional Example 2. The gate driving device 600 of Conventional Example 2 is similar to the gate driving device 600 of the present embodiment shown in FIG. 2 except that the feedback current control unit 12 is removed. Components similar to those shown in FIG. 2 will be described simply by identifying them with the same reference numeral.

Figure 11:
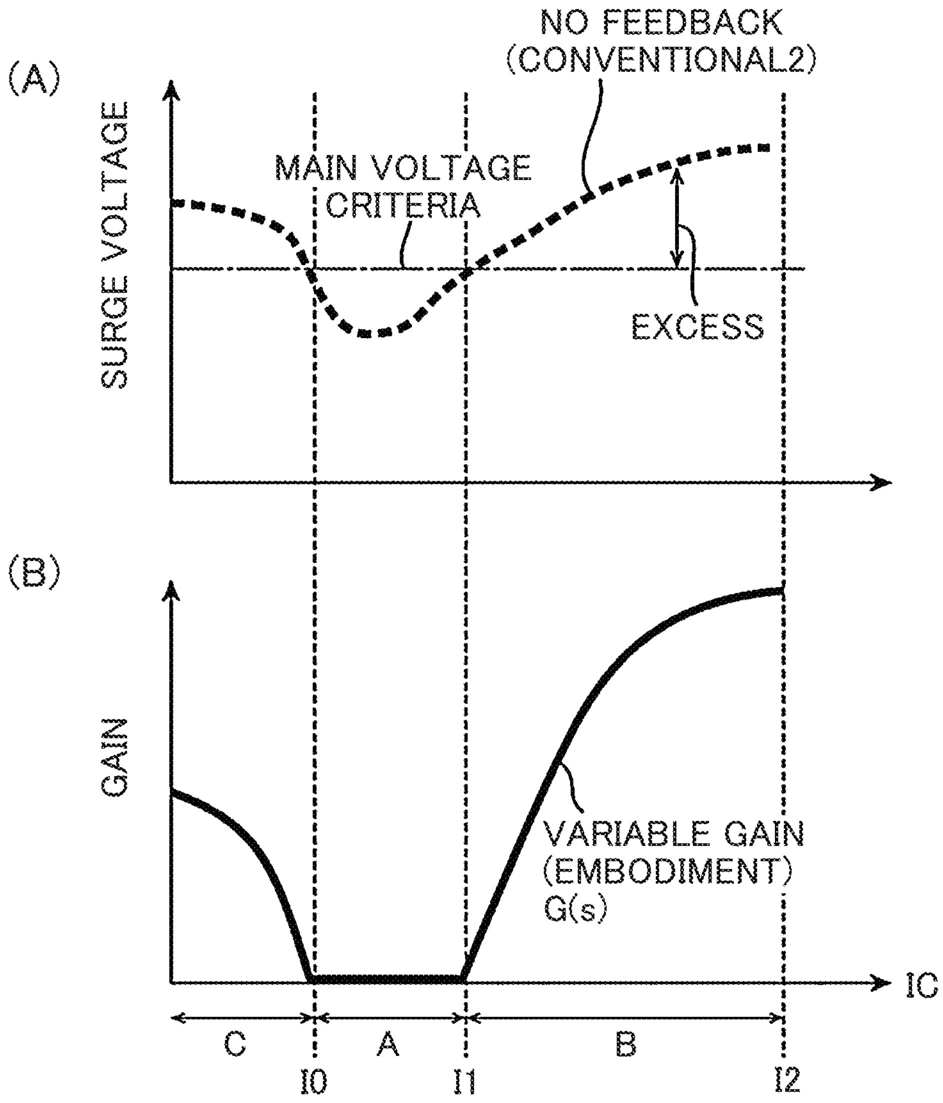
FIG. 11 is a view showing an example of main current dependence of surge voltage of a semiconductor switching element in Modification Example 1 and gain setting in Example 1.

The operation of the gate driving device 600 of Conventional Example 2 will be described. First, during the term in which the drive command signal P from the pulse generator 400 is at a high potential (ON), the drive signal generator circuit unit 6 operates to turn the first MOSFET 7 ON and turn the second MOSFET 8 OFF. As a result, a current flows between the collector and the emitter of the semiconductor switching element 101 (turned ON). During the term in which the drive command signal P is at a low potential (OFF), the first MOSFET 7 is turned OFF and the second MOSFET 8 is turned ON through the drive signal generator circuit unit 6. This stops a collector-emitter current of the semiconductor switching element 101 (turned OFF). In another example 2 described in FIG. 13, a feedback current control unit which is present in the present Example or another example 1 described in FIG. 11 is not originally present so that the surge voltage cannot be suppressed at all.

Next, a difference between the operation performed by the gate driving device 600 of the present Example and the operation performed by the gate driving device 600 of the aforesaid Conventional Examples 1 and 2 will be described using FIGS. 7 and 8. More specifically, a difference in the waveform during turn-off between the worst conditions and ordinary conditions of the semiconductor switching element will be described.

Figure 7:
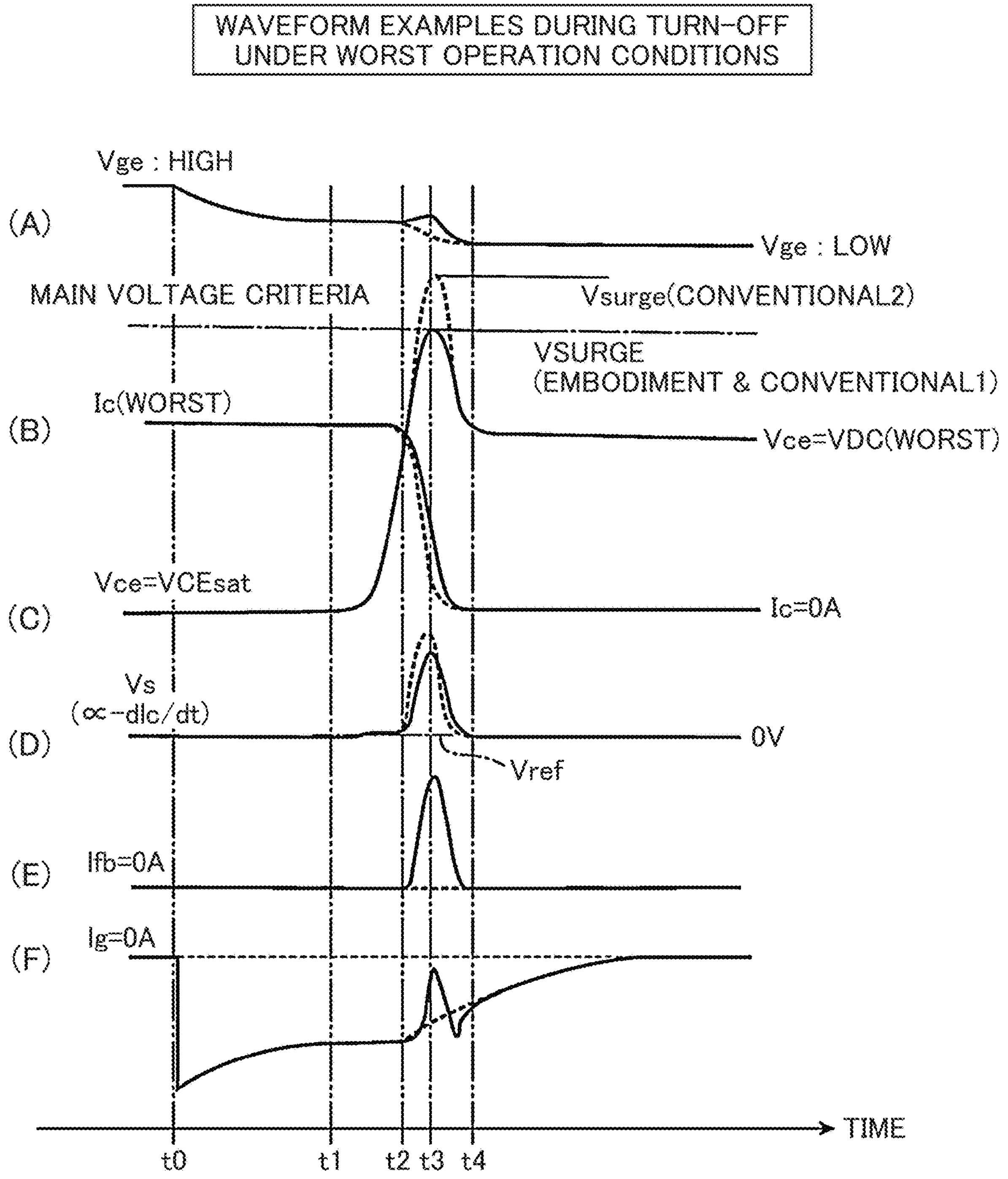
FIG. 7 is a view showing a waveform example of the semiconductor switching element of Example 1 during turn-off under the worst operation conditions.

In FIG. 7, each chart shows an example of waveform during turn-off under the worst operation conditions of the semiconductor switching element 101 (operation conditions under which the surge voltage has the maximum peak, for example, conditions under which the main current and/or bus voltage is at its maximum or conditions under which the junction temperature of the element is at its lowest).

The solid line in each view of FIG. 7 shows the turn-off waveform when the gate driving devices 600 of Example 1 and Conventional Example 1 are used. The broken line shows a turn-off waveform when the gate driving device 600 of Conventional Example 2 is used. Under the worst operation conditions, the waveforms are the same in Example 1 of the present invention and Conventional Example 1 because the respective driving conditions can be optimized equally. The following description on the operation under the worst operation conditions therefore does not include a description on Conventional Example 1 and a difference between Example 1 and Conventional Example 2 will be described.

FIG. 7(A) shows a gate-emitter voltage Vge (which will hereinafter be called "Vge") of the semiconductor switching element 101 during turn-off. FIG. 7(B) shows a main current Ic (which will hereinafter be called "Ic") that flows to the emitter of the semiconductor switching element 101. FIG. 7(C) shows a main voltage Vce (which will hereinafter be called "Vce") to be applied to between the collector and emitter of the semiconductor switching element 101. FIG. 7(D) shows detection results Vs (which will hereinafter be called "Vs") of a time change rate dIc/dt of the main current of the semiconductor switching element 101. In this example, the following relationship: $Vs^4$–dIc/dt holds. FIG. 7(E) shows a feedback current Ifb (which will hereinafter be called “Ifb”) of the feedback current control unit 12. FIG. 7(F) shows a gate current Ig (which will hereinafter be called “Ig”) of the semiconductor switching element 101.

The turn-off operation of the present Example will hereinafter be described specifically with reference to the waveform in each view of FIG. 7. As shown in FIG. 7(A), when the turn-off operation is started at time to, Vge of the semiconductor switching element 101 starts to drop. At the same time, as shown in FIG. 7(F), an electric current starts to flow from the gate of the semiconductor switching element 101. This means that a negative gate current Ig starts to flow. As shown in FIG. 7(C), the main voltage Vce starts to increase from time t1. At this time, Vge and Ig are in a period (mirror period) of almost constant value due to a mirror effect. The mirror period ends at time t2.

At the same time, as shown in FIG. 7(B), the main current Ic starts to decrease. Then, as shown in FIG. 7(D), Vs starts to increase. At time t3, Vs reaches its maximum value. Then, as shown in FIG. 7(C), the surge voltage of the main voltage Vce also reaches the maximum value. Then, as shown by the broken line of FIG. 7(C), in Conventional Example 2, the surge voltage of the main voltage Vce exceeds main voltage criteria.

The term “main voltage criteria” as used herein means designed criteria of the main voltage Vce obtained by subtracting a predetermined design margin from the rated voltage of the power element. In general, the gate driving conditions are designed so that the surge voltage does not exceed the main voltage criteria. Accordingly, in the practical design of Conventional Example 2, the gate driving conditions (such as the off-side gate resistor 10 in FIG. 6) are adjusted so that the switching speed is slower than the broken line shown in FIG. 7(C) (in other words, so that the surge voltage is lower and the switching loss is larger). Here, for comparison, the turn-off waveform shown here is that obtained by driving the gate driving device 600 of Conventional Example 2 under the gate driving conditions similar to those of the gate driving circuit unit 11 of Example 1.

The main current Ic continues to decrease until time t4. During the period from time t2 to t4, the feedback current Ifb is output from the feedback current control unit 12 of the present Example as shown in FIG. 7(E). Since the feedback current Ifb is added to the gate of the semiconductor switching element 101 in a direction opposite to Ig, an absolute value of the gate current Ig of the present Example decreases by an absolute value of the feedback current Ifb compared with Conventional Example 2 as shown in FIG. 7(F). In addition, at time t3, as shown in FIG. 7(E), the feedback current Ifb reaches the maximum value. Along with this, as shown in FIG. 7(F), the decrease of the absolute value of the gate current Ig of the present Example also reaches a maximum value, compared with Conventional Example 2.

During the period from time t2 to t4, as shown in FIG. 7(B), this makes the switching speed (a decreasing rate of Ic) of the main current of the present Example (solid line) slower than that of Conventional Example 2 (broken line) which does not have a feedback current. Along with this, as shown in FIG. 7(D), the Vs of the present Example (solid line) is smaller than that of Conventional Example 2 (broken line). This suppresses, as shown in FIG. 7(C), the surge voltage of the present Example (solid line) below the main voltage criteria.

Figure 8:
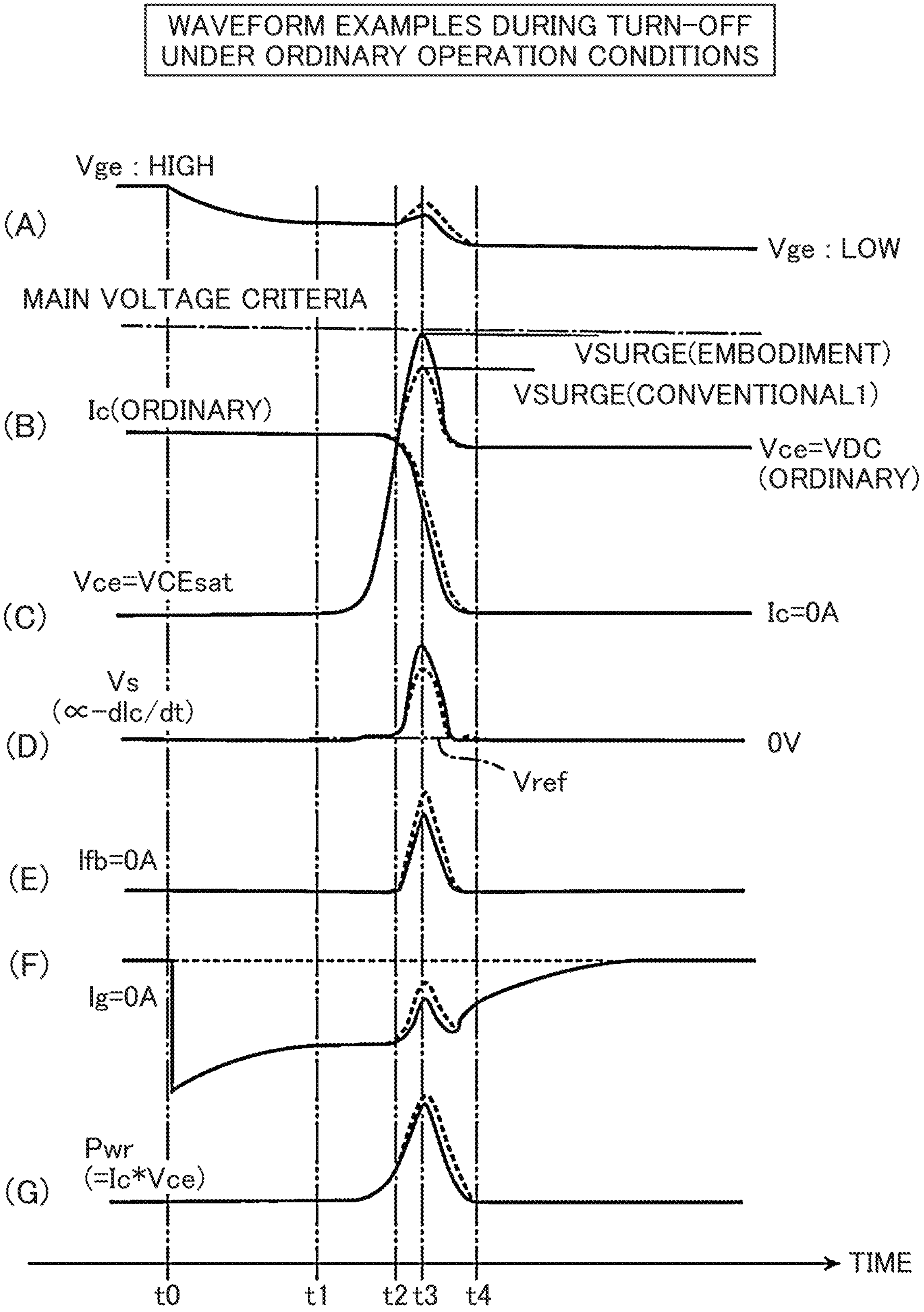
FIG. 8 is a view showing a waveform example of the semiconductor switching element of Example 1 during turn-off under ordinary operation conditions.

Each view in FIG. 8 shows an example of the waveform during turn-off under the ordinary operation conditions of the semiconductor switching element 101 (operation conditions other than the aforesaid worst conditions, for example, under conditions under which the main current and/or main voltage is not the maximum or conditions under which the junction temperature of the element is not the lowest). In the case of the ordinary conditions, different from the case of the worst conditions, there occurs a difference also in the waveform of Conventional Example 1which has employed a feedback current so that a difference between the present Example and Conventional Example 1 will be described using this figure. The solid line in each view of FIG. 8 is a turn-off waveform of the present Example, while a dotted line is a turn-off waveform of Conventional Example 1.

FIG. 8(A) to FIG. 8(F) correspond to FIG. 7(A) to FIG. 7(F), respectively. FIG. 8(G) shows heat generation Pwr of the semiconductor switching element 101. The time-integrated value of Pwr (meaning the area of Pwr waveform) is switching loss.

The operation of the semiconductor switching element 101 under the ordinary conditions will next be described specifically with reference to each view of FIG. 8. In the worst operation conditions, as described above, the turn-off waveform in the present Example and that in Conventional Example 1 are equivalent. In the ordinary conditions, however, as shown in each view of FIGS. 8(A) to FIG. 8(G), the waveform in the present Example is different from that of Conventional Example 1 during the period from time t2 to t4. The difference will hereinafter be described mainly.

The basic operation during the period from time t2 to t4 is equivalent to that in FIG. 7, but they are different in the magnitude of the feedback current Ifb. Here, the gain G of Conventional Example 1 shown by Equation 7 is fixed regardless of the operation conditions so that it is as high as that in the worst conditions. As shown by a dotted line of FIG. 8(C), therefore, the surge voltage is excessively suppressed and is smaller than necessary than the main voltage criteria. This means that the switching speed excessively slows down. This increases the heat generation Pwr as shown in FIG. 8(G) and increases switching loss during turn-off.

On the other hand, the gain G(s) of the present Example shown by Equation 3 can be changed according to the operation conditions so that the gain G(s) of Equation 3 can be made smaller than that under the worst conditions. This makes, as shown in FIG. 8(E), the feedback current Ifb (solid line) of the present Example smaller than the feedback current Ifb (dotted line) of Conventional Example 1 and also makes, as shown in FIG. 8(F), a decrease of the absolute value of the gate current of the present Example smaller than that of Conventional Example 1. This makes it possible to make the switching speed in the present Example (decreasing rate of Ic) faster than that of Conventional Example 1 as shown in FIG. 8(B) and thereby reduce the heat generation Pwr as shown in FIG. 8(G). In short, this makes it possible to reduce the switching loss during turn-off. Thus, by properly changing G(s) of the present Example according to the operation conditions, it is possible to adjust the switching speed to the extent that the surge voltage does not exceed the main voltage criteria and thereby satisfy both suppression of the surge voltage and reduction in switching loss.

Next, a method of adjusting the gain G(s) will be described. It is desired to change the gain G(s) according to the operation conditions and determine the switching speed to be the maximum to the extent that the surge voltage does not exceed the main voltage criteria. Sensing values each indicating operation conditions are input to the gain control circuit unit 21. The gain control circuit unit 21 convers the sensing value to a voltage control signal s as an intermediate value and outputs it to the variable gain amplifier circuit unit 15. The variable gain amplifier circuit unit 15 determines a gain G(s) according to the value of the voltage control signal s. Since the gain control circuit unit 21 and the variable gain amplifier circuit unit 15 can be realized in various circuit combinations, a method of realizing various functions of the gain G(s) with respect to the voltage control signal s is also possible. For example, the constitution may be such that the gain G(s) is changed in proportion to s or it is changed in reverse proportion to s. On the other hand, it is effective to determine the method of changing (adjusting) the gain G(s) according to the operation conditions as described below.

The adjusting method of G(s) is determined based on an excess of the surge voltage of the semiconductor switching element 101 that exceeds the main voltage criteria supposing that there is no feedback current (for example, when the input of the gain control circuit unit 21 is adjusted to G(s)=0). G(s) is changed to be large under operation conditions with a large excess and G(s) is changed to be small under operation conditions with a small excess. In short, the gain G(s) monotonously increases in a region where the surge voltage exceeds the main voltage criteria. In a region where the surge voltage does not exceed the main voltage criteria, on the other hand, the gain G(s) is zero because there is no need to suppress the surge voltage. This means that it is a dead zone. Here, the gain G(s) of the dead zone is regarded as zero even if it is a very small value. The term "very small value" as used herein means, for example, a value such that the absolute value of a feedback current multiplied by the gain G(s) is 5% or less of the absolute value of a gate current (mirror period).

A specific method of adjusting the gain G(s) will hereinafter be described with reference to FIGS. 9 to 14.

Figure 9:
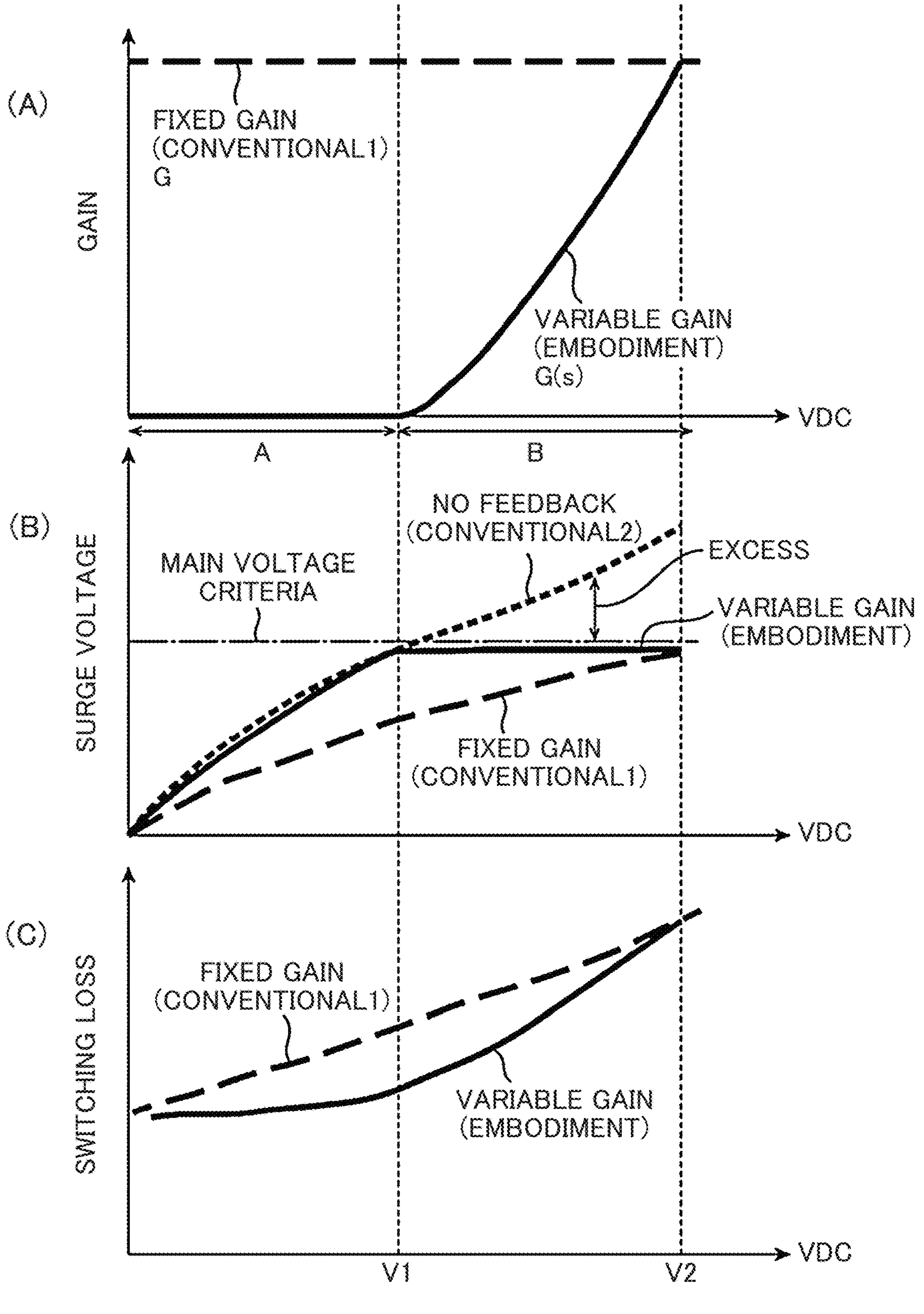
FIG. 9 is a view showing an example of bus voltage dependence of gain setting in Example 1, surge voltage of the semiconductor switching element, and switching loss of the semiconductor switching element.

FIGS. 9(A), 9(B), and 9(C) are views showing examples of bus voltage VDC dependence of the gain setting of Example 1 and Conventional Example 1, the surge voltage of the semiconductor switching element 101, and the switching loss of the semiconductor switching element 101, respectively. In each view of FIG. 9, the solid line shows the characteristic of Example 1 and the broken line shows that of Conventional Example 1. The dotted line in FIG. 9(B) shows the characteristic of Conventional Example 2 having no feedback current.

When the bus voltage VDC reaches the maximum bus voltage V2 which is an assumed voltage in practical use, the operation conditions of the semiconductor switching element 101 are the worst operation conditions shown in FIG. 7. In this case, as shown in FIGS. 9(A) and 9(B), a gain is set so that the surge voltage can be suppressed within the main voltage criteria. Under the worst conditions, the suppression amount of the surge voltage is same so that the set value of the gain G(s) of Example 1 and that of the gain G of Conventional Example 1 are the same.

Next, when the bus voltage VDC is smaller than the maximum bus voltage V2, the operation conditions of the semiconductor switching element 101 are the ordinary operation conditions (a region where the bus voltage VDC is less than V2) shown in each view of FIG. 8. In this case, as shown in FIG. 9(B), with a decrease of the bus voltage VDC from V2, the surge voltage in Conventional Example 2 having no feedback current (No Feedback) shows a monotonous decrease. It is to be noted that in the present Example, the maximum bus voltage V2 is, for example, a value ranging from 50 to 80% of a rated voltage of the semiconductor switching element.

A method of adjusting the gain G(s) of Example 1 is different between a region B where the bus voltage VDC is V1 or more and less than V2 and a region A where the bus voltage VDC is 0 or more and less than V1. The bus voltage V1 is a voltage at which the excess of the surge voltage with respect to the main voltage criteria is zero. Supposing that there is no feedback current, the excess of the surge voltage decreases with a decrease in the bus voltage VDC in the region B where the surge voltage exceeds the main voltage criteria so that the set value of the gain G(s) of Example 1 monotonously decreases. In the region A, the surge voltage of the semiconductor switching element 101 is the main voltage criteria or less even if the feedback current to be output from the feedback current control unit 12 is not caused to flow. This means that in this region, the set value of the gain G(s) of Example 1 is preferably set at zero because there is no need to suppress the surge voltage. In short, the region A is a dead zone where the feedback control of the feedback current control unit 12 of Example 1 is invalidated. It is to be noted that a boundary voltage V1 at the boundary between the region A and the region B is, for example, a value ranging from 30 to 50% of the aforesaid rated voltage in the present Example.

By adjusting the gain G(s) as described above, as shown in FIG. 9(C), under the worst conditions, that is, when the bus voltage VDC value is the maximum bus voltage V2, the switching loss during turn-off is the same between Example 1 and Conventional Example 1, but when the bus voltage VDC value is less than the maximum bus voltage V2, the switching loss in Example 1 is smaller than that in Conventional Example 1. In short, by adjusting the gain G(s) in the feedback current control unit 12 of Example 1 according to the operation conditions of the semiconductor switching element, the switching loss of the semiconductor switching element 101 can be reduced.

Figure 10:
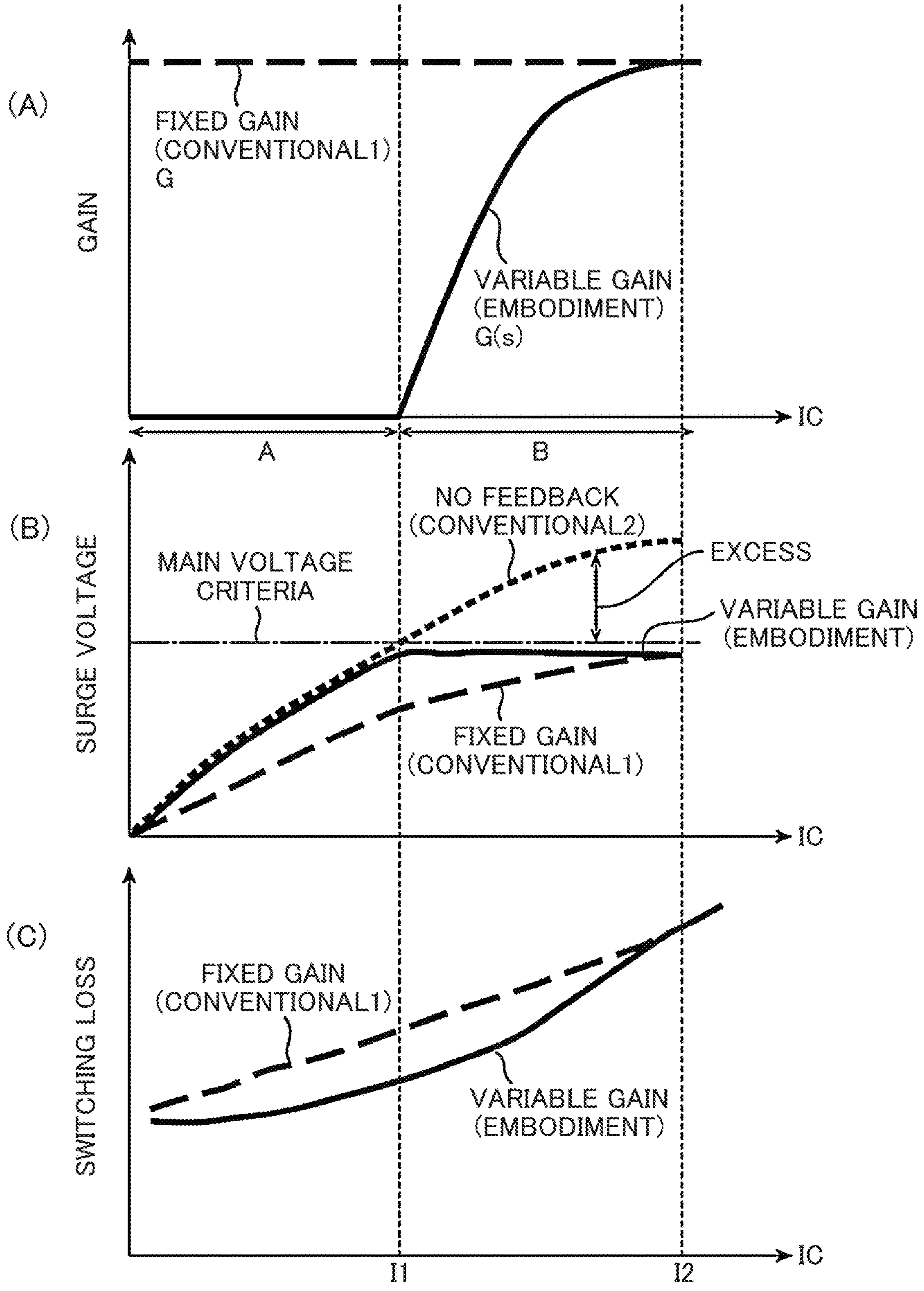
FIG. 10 is a view showing an example of main current dependence of gain setting in Example 1, surge voltage of the semiconductor switching element, and switching loss of the semiconductor switching element.

The method of adjusting the gain G(s) based on the bus voltage was described in FIG. 9. It can also be adjusted based on the main voltage. FIGS. 10(A), (B), and (C) are views respectively showing examples of the main current dependence of the gain setting, the surge voltage of the semiconductor switching element 101, and the switching loss of the semiconductor switching element in Example 1 and Conventional Example 1. In each view of FIG. 10, the solid line shows a waveform of Example 1 and the broken line shows a waveform of Conventional Example 1. The dotted line in FIG. 10(B) shows a waveform of Conventional Example 2 having no feedback current. FIG. 10 will be described simply because it is similar to FIG. 9.

As shown in FIG. 10(A), the gain G(s) of Example 1 has two regions, that is, a dead zone (a region A having a predetermined current I1 or less) and a monotonously increasing region (a region B having a predetermined current I1 to I2) according to a change in the main current Ic. In Example 1, as shown in FIG. 10(B), this makes it possible to change the suppression amount of the surge voltage according to a change in main current Ic. As shown in FIG. 10(C), this makes it possible to make the switching loss of Example 1 smaller than that of Conventional Example 1 under ordinary operation conditions of the semiconductor switching element 101, as in the case of FIG. 9(C). It is to be noted that in the present Example, the maximum value I2 of the main current in FIG. 10 is, for example, a value ranging from 1 to 2 times the rated current of the semiconductor switching element 101. The boundary current I1 at the boundary between the region A and the region B is, for example, a value ranging from 20 to 80% of the aforesaid rated current.

When the semiconductor switching element 101 is IGBT, the design of the IGBT chip sometimes increases a turn-on speed in a region where the main current Ic is small and allows the recovery surge voltage of a paired arm (for example, an upper arm when turning on with a lower arm) to exceed the main voltage criteria during turn-on.

FIG. 11(A) shows the main current dependence of the recovery surge voltage when such a semiconductor switching element of another example 1 is driven without feedback current (No Feedback). FIG. 11(B) shows the main current dependence of the gain G(s) in Example 1 using the semiconductor switching element of another example 1. The gain G(s) is adjusted according to the magnitude of the excess in the regions C and B where the excess of the recovery surge voltage is positive with respect to the main voltage criteria. In the region A where the recovery surge voltage does not exceed the main voltage criteria, the gain G(s) is set at zero.

Figure 12:
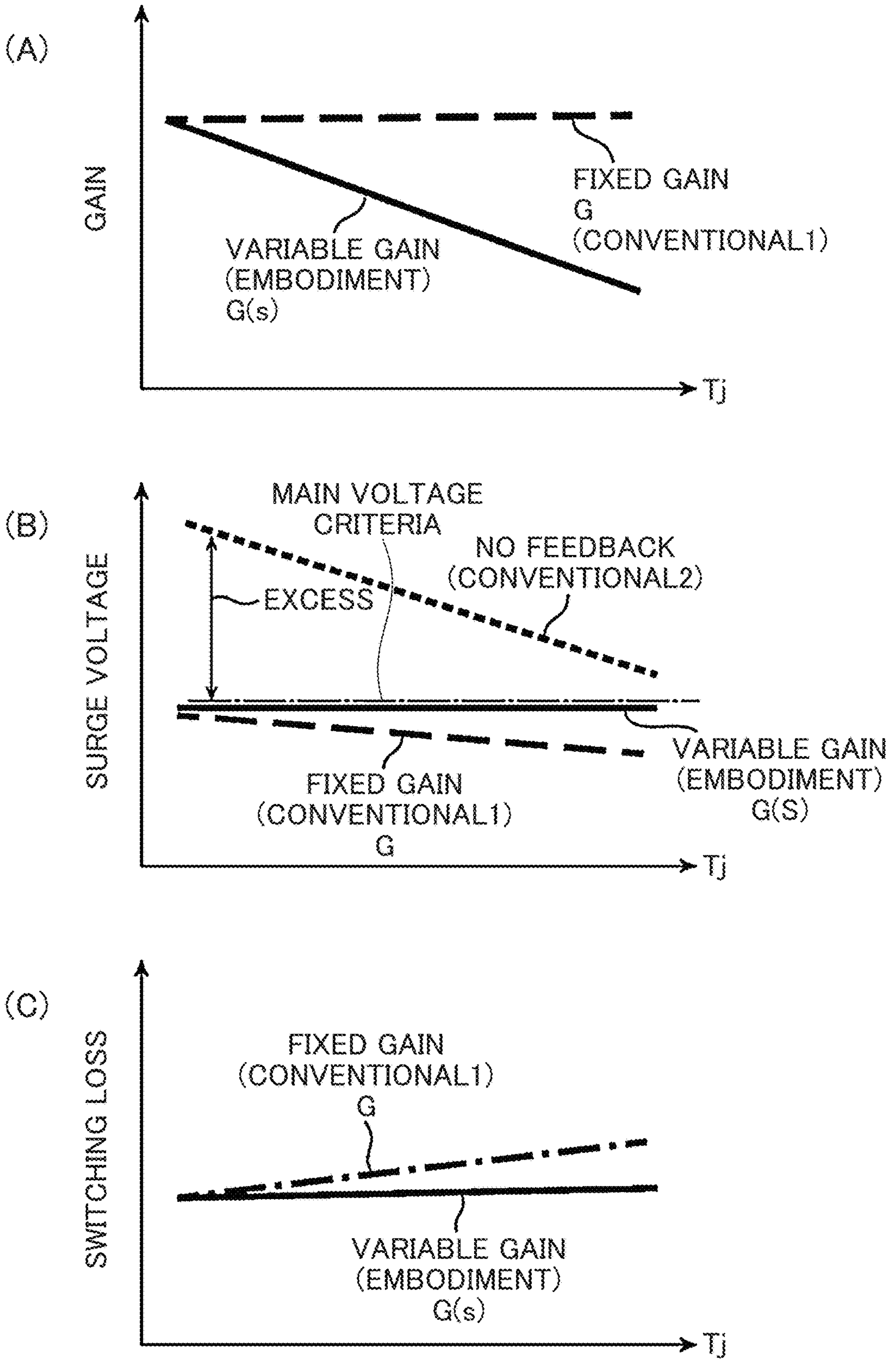
FIG. 12 is a view showing an example of junction temperature dependence of gain setting in Example 1, surge voltage of the semiconductor switching element, and switching loss of semiconductor switching element.

FIGS. 12(A), 12(B), and 12(C) are views respectively showing examples of the junction temperature dependence of the gain setting, the surge voltage of the semiconductor switching element 101 during turn-off, and the switching loss of the semiconductor switching element in Example 1 and Conventional Example 1. In each view of FIG. 12, the solid line shows the waveform of Example 1 and the broken line shows the waveform of Conventional Example 1. The dotted line of FIG. 12(B) shows the waveform of Conventional Example 2 having no feedback current.

In this case, as shown in FIG. 12(B), such a characteristic that the turn-off surge voltage of the semiconductor switching element 101 having no feedback current (dotted line) decreases with an increase in junction temperature Tj. This means that with an increase in the junction temperature Tj, the excess of the surge voltage exceeding the main voltage criteria decreases. As shown in FIG. 12(A), therefore, the gain G(s) of the present embodiment is preferably decreased monotonously with an increase in the junction temperature Tj. In the present Example, G(s) does not have a dead zone because supposing that there is no feedback current, the surge voltage exceeds the main voltage criteria in all junction temperature ranges. By setting G(s) according to the excess in such a manner, the surge voltage of the present embodiment can be kept at constant as shown by the solid line of FIG. 12(B) and the switching loss can be made smaller than that of Conventional Example 1 as shown in FIG. 12(C).

Figure 13:
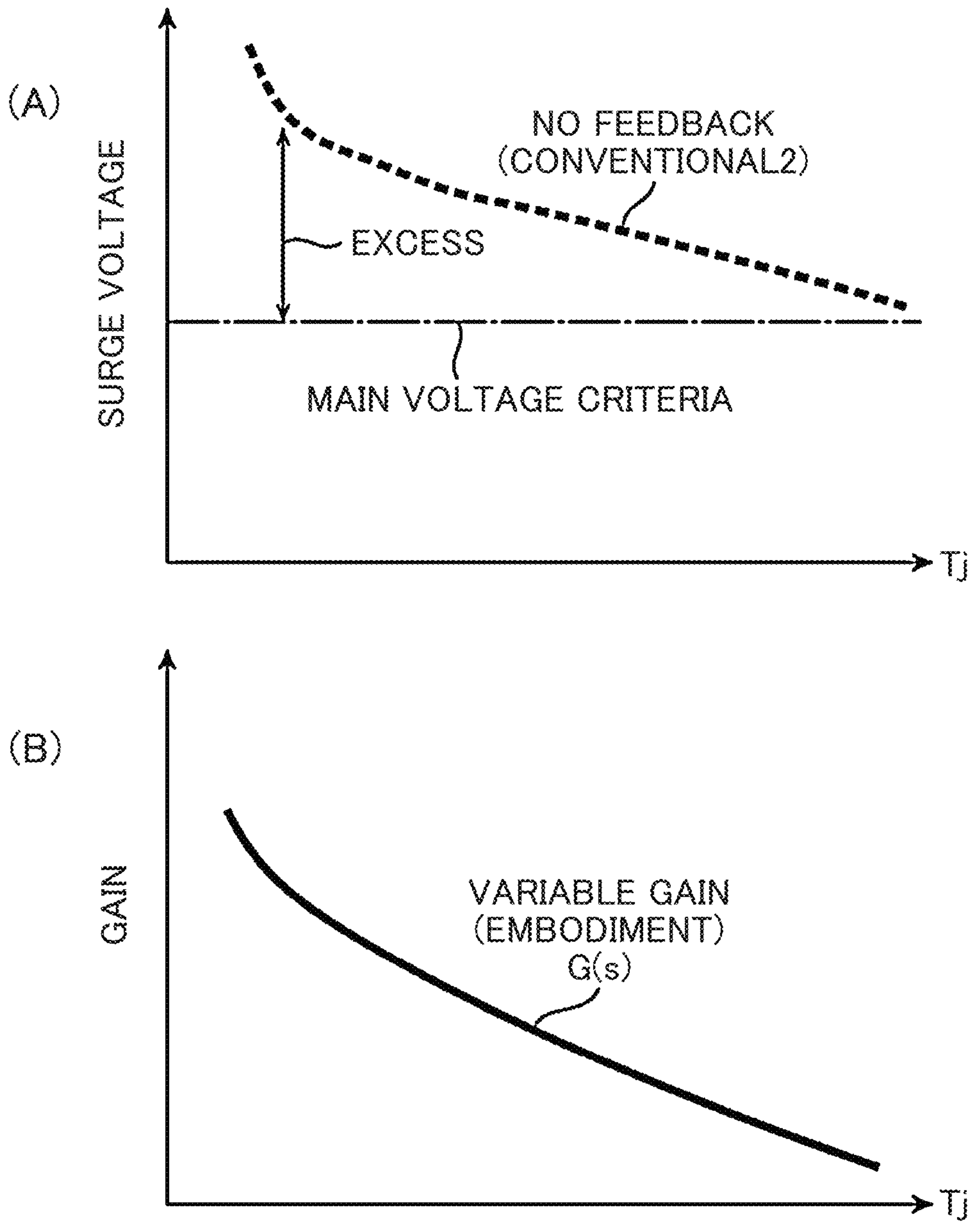
FIG. 13 is a view showing an example of temperature dependence of surge voltage of a semiconductor switching element of Modification Example 2 and gain setting of First Embodiment.

FIG. 13 shows examples of the temperature dependence of the surge voltage of the semiconductor switching element in another example 2 and the gain setting in Example 1. As shown in FIG. 13(A), there is a case where the surge voltage of the semiconductor switching element 101 shows a drastic increase as the junction temperature Tj enters a low temperature region, which depends on the characteristic of IGBT or a main circuit parasitic inductance 107. In such a case, as shown in FIG. 13(B), it is preferred to cause a monotonous decrease to form a downward protrusion with respect to an increase in junction temperature T by drastically increasing the gain G(s) in the low temperature region.

Figure 14:
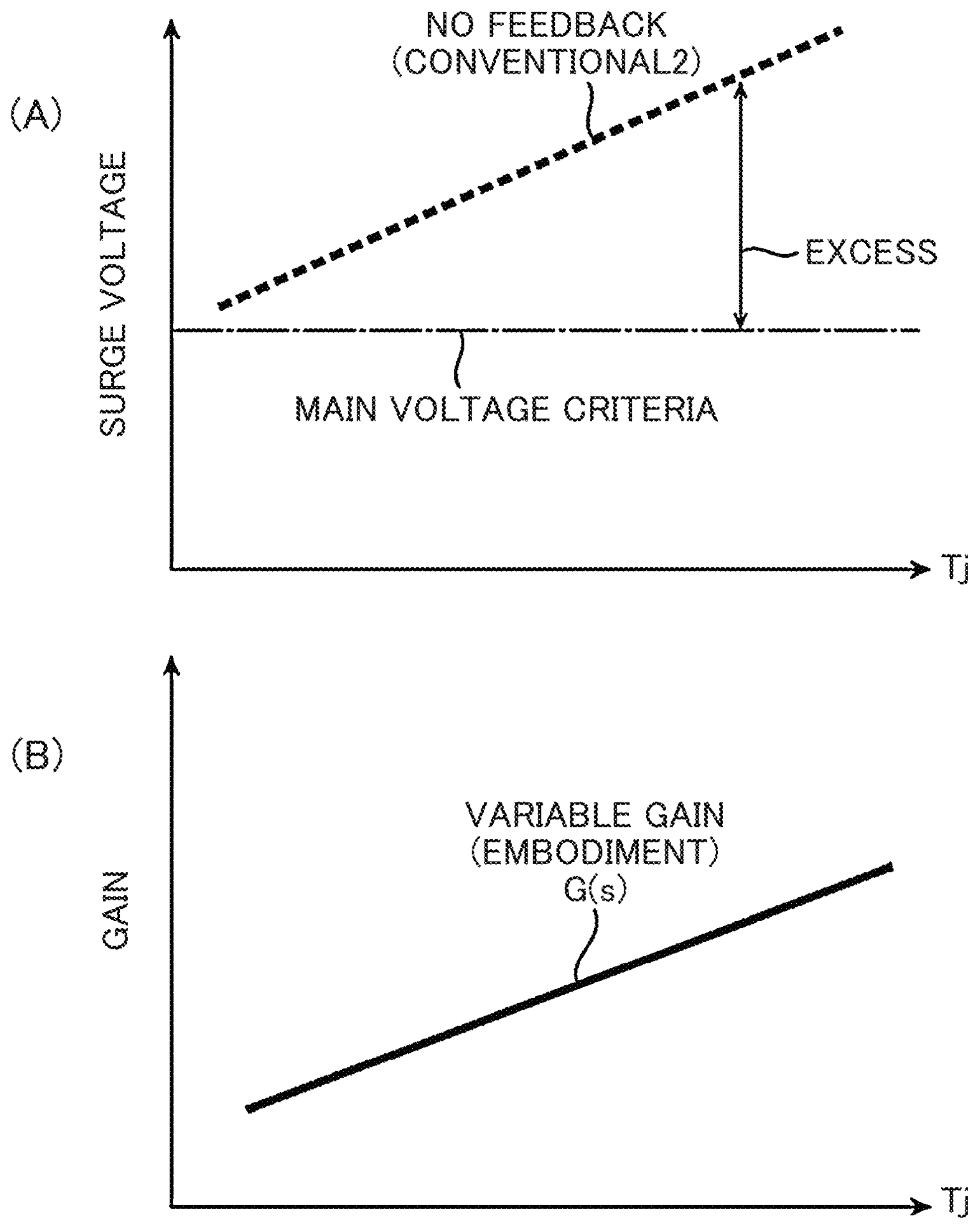
FIG. 14 is a view showing an example of temperature dependence of a surge voltage of a semiconductor switching element of Modification Example 3 and gain setting of First Embodiment.

FIG. 14 shows the temperature dependence of the surge voltage of the semiconductor switching element of another example 3 and the gain setting of Example 1. As shown in FIG. 14(A), when the semiconductor switching element is SiC MOSFET, the recovery surge voltage of a paired arm during turn-on may be larger with an increase in the junction temperature Tj. This means that supposing that there is no feedback current, the excess of the surge voltage over the main voltage criteria also is larger. In the case of turn-on switching of the SiC MOSFET, it is preferred to monotonously increase the set value of the gain G(s) with an increase in junction temperature Tj, as shown in FIG. 14(B).

Modification Example of Example 1

In Example 1, the feedback current control unit 12 can be used exclusively for turn-off. In this case, however, an unnecessary feedback current Ifb due to a time change rate dIc/dt of a current is formed at the feedback current control unit 12 during turn-on and this may affect the operation of the semiconductor switching element 101. It is therefore preferred to add a function of invalidating the feedback current control unit 12 during turn-on. Modification Example of Example 1 is a circuit example having this function in addition. A circuit exclusive for turn-off will be described as an example, but the description will also apply to a circuit exclusive for turn-on.

Figure 15:
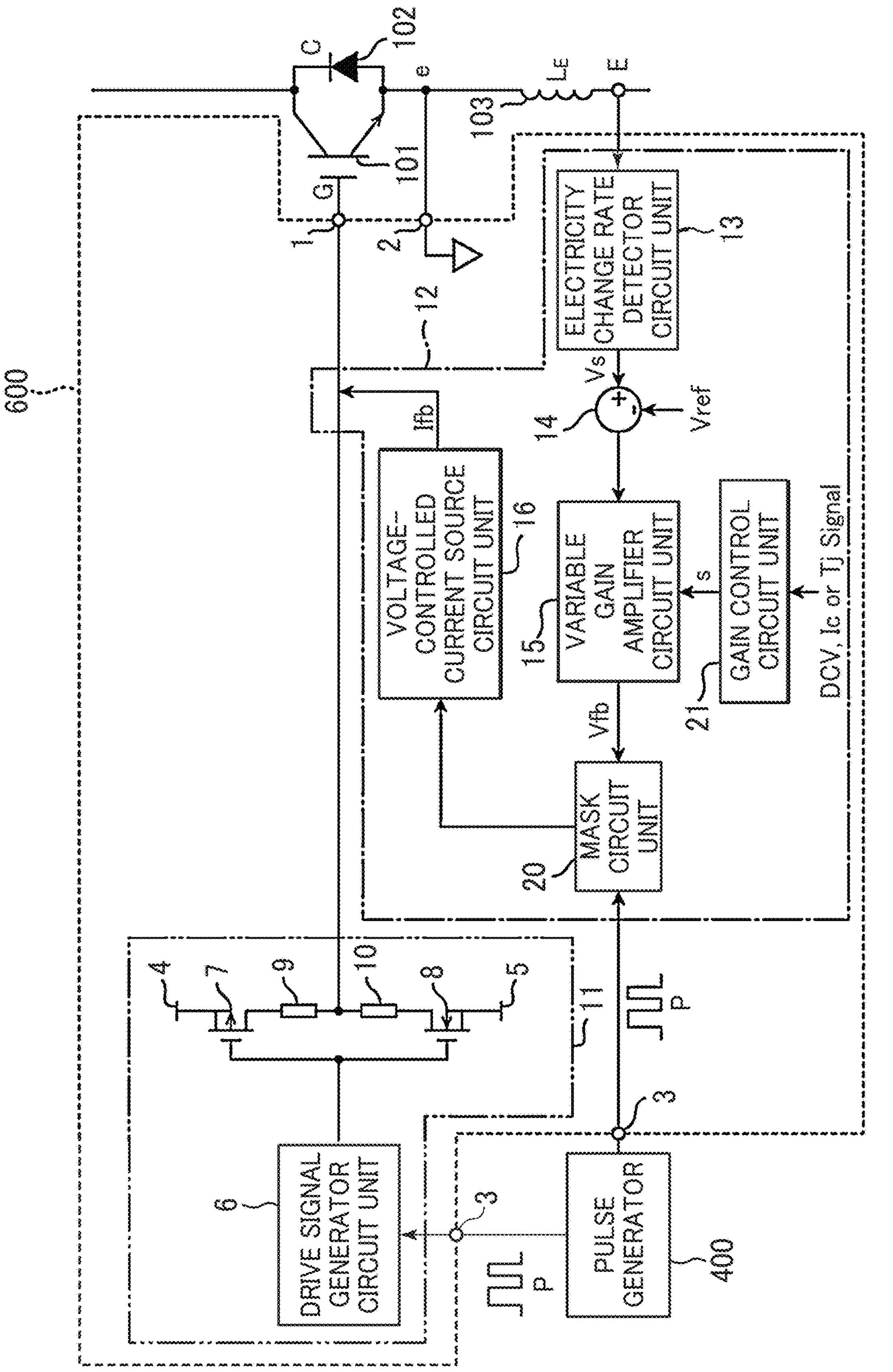
FIG. 15 is a basic circuit block diagram of a gate driving device of Modification Example of Example 1.

FIG. 15 is a block diagram of the basic circuit of a gate driving device 600 of Modification Example of Example 1. A feedback current control unit 12 of Modification Example of Example 1 has a constitution similar to that of the feedback current control unit 12 of Example 1 shown in FIG. 2 except that it has a mask circuit unit 20 in addition. A difference from FIG. 2 will hereinafter be described.

The mask circuit unit 20 is placed between the variable gain amplifier circuit unit 15 and the voltage-controlled current source circuit unit 16. The output terminal of the variable gain amplifier circuit unit 15 is connected to the input terminal of the mask circuit unit 20. The output terminal of the mask circuit unit 20 is connected to the input terminal of the voltage-controlled current source circuit unit 16. Further, the control input terminal of the mask circuit unit 20 is connected to the pulse generator 400 and receives a command signal P from the pulse generator 400.

The mask circuit unit 20 is composed of, for example, a voltage control switch. When the command signal P is a high voltage (on), the mask circuit unit 20 connects the output terminal of the variable gain amplifier circuit unit 15 to the reference potential and blocks the feedback voltage Vfb from the variable gain amplifier circuit unit 15. When the command signal P is a low voltage (off), the mask circuit unit 20 connects the output terminal of the variable gain amplifier circuit unit 15 to the voltage-controlled current source circuit unit 16 and outputs a feedback voltage Vfb to the voltage-controlled current source circuit unit 16. This makes it possible to invalidate the feedback current control unit 12 during turn-on and activate the feedback current control unit 12 during turn-off. Therefore, this makes it possible to suppress an unnecessary feedback current Ifb, which is formed due to the time change rate dIc/dt of the current in the feedback current control unit 12 during turn-on, from affecting the operation of the semiconductor switching element 101.

Example 2

Figure 16:
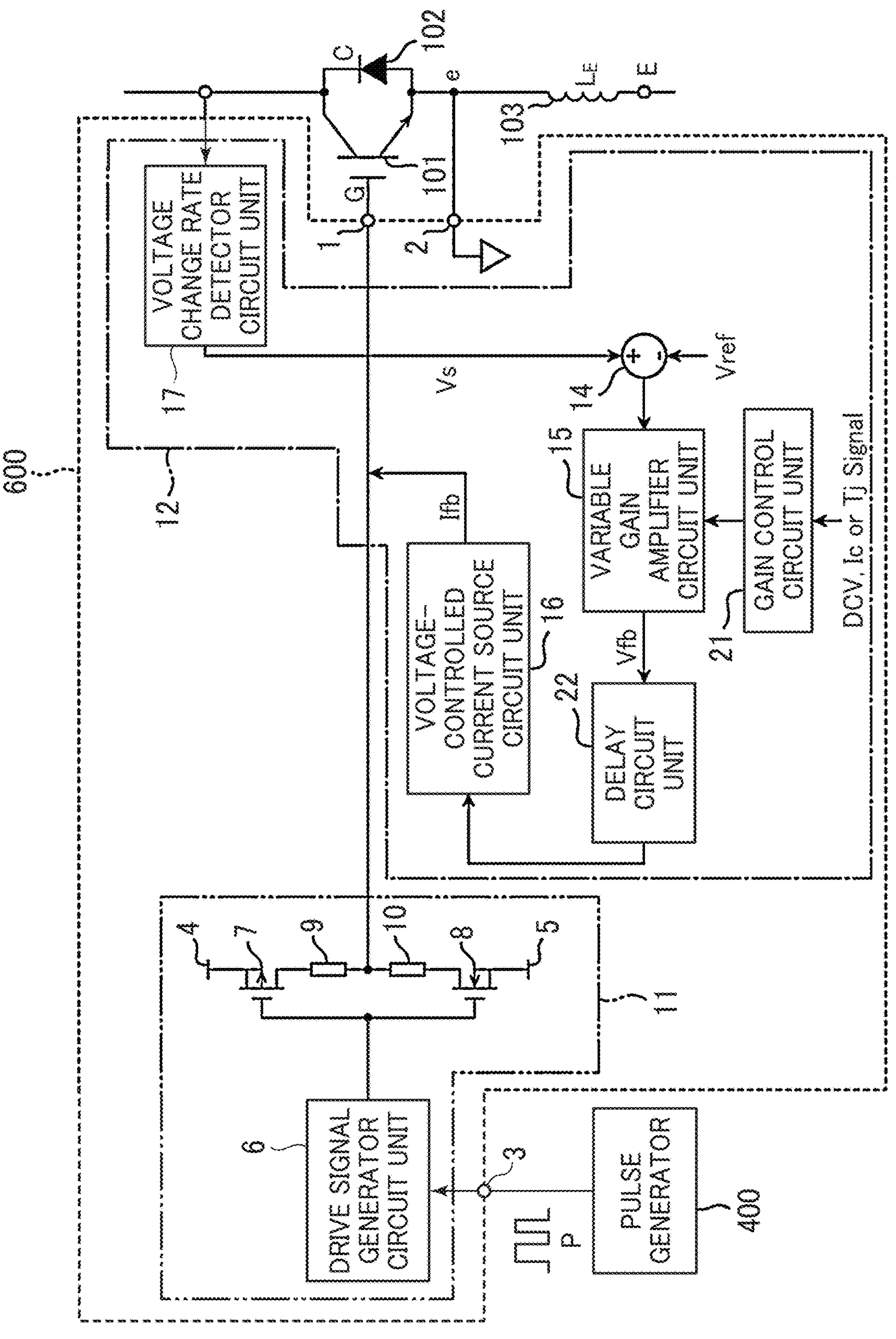
FIG. 16 is a basic circuit block diagram of a gate driving device of Example 2.

FIG. 16 is a block diagram of the basic circuit of a gate driving device of Example 2. The gate driving device 600 of Example 2 has a constitution similar to that of the gate driving device 600 of Example 1 shown in FIG. 2 except that in the feedback current control unit 12, the current change rate detector circuit unit 13 as an electricity change rate detector circuit unit is replaced by a voltage change rate detector circuit unit 17 and a delay circuit unit 22 is added. This device will hereinafter be described while focusing on the difference. The operation of the semiconductor switching element 101 during turn-off will be described, but the operation during turn-on is similar thereto.

The voltage change rate detector circuit unit 17 is connected to the collector terminal of the semiconductor switching element 101. The voltage change rate detector circuit unit 17 has, for example, a differentiation circuit and a rectifier circuit each composed of a condenser and a resistor. The output terminal of the voltage change rate detector circuit unit 17 is connected to the subtractor 14. The voltage change rate detector circuit unit 17 detects a time change rage of the main voltage Vce of the semiconductor switching element 101, rectifies, and forms a detection voltage Vs(t). The Vs(t) at time t can be represented by the following equation.

$$Vs(t) = RC \times dv/dt(t) \quad \text{Equation 8}$$

In the above equation, dv/dt(t) is a time change rate of the main voltage of the semiconductor switching element. RC is a time constant of the differentiation circuit in the voltage change rate detector circuit unit 17.

The delay circuit unit 22 is placed between the variable gain amplifier circuit unit 15 and the voltage-controlled current source circuit unit 16. The delay circuit unit 22 adds a delay d to the feedback voltage Vfb received from the variable gain amplifier circuit unit 15 and outputs the result to the voltage-controlled current source circuit unit 16. It is to be noted that the delay circuit unit 22 may be omitted when a proper delay d can be ensured by the circuit constitution. In this case, the variable gain amplifier circuit unit 15 is connected directly to the voltage-controlled current source circuit unit 16.

The feedback current Ifb in the feedback current control unit 12 of Example 2 is represented by the following equation.

$$Ifb(t+d) = G(s) \times g \times (Vs(t) - Vref) \quad \text{Equation 9}$$

In the above equation, Vs(t) is a detection result of the voltage change rate detector circuit unit 17 at time t. Ifb(t+d) is a feedback current at time t+d. d is a circuit delay. G(s) is a voltage gain of the variable gain amplifier circuit unit 15 and g is an amplification factor of the voltage-controlled current source circuit unit 16. Vref is a reference voltage. The value of Vref is, for example, 0. The gain G(s) is adjusted according to the value of the gain control signal s. g is a fixed value. It is to be noted that the amplification factor g may be g(s) that depends on the gain control signal s or the gain G(s) may be a fixed value G.

As in Example 1, the feedback current Ifb can reduce the absolute value of the gate current of the semiconductor switching element 101. This reduces the switching speed of the semiconductor switching element 101 and suppresses the surge voltage. The method of adjusting the gain in Example 2 is similar to that in Example 1. The feedback current Ifb can be adjusted flexibly by changing the gain G(s) according to the operation conditions of the semiconductor switching element 101. This makes it possible to reduce the switching loss while suppressing the surge voltage to the main voltage criteria or less according to the operation conditions of the semiconductor switching element 101.

Figure 17:
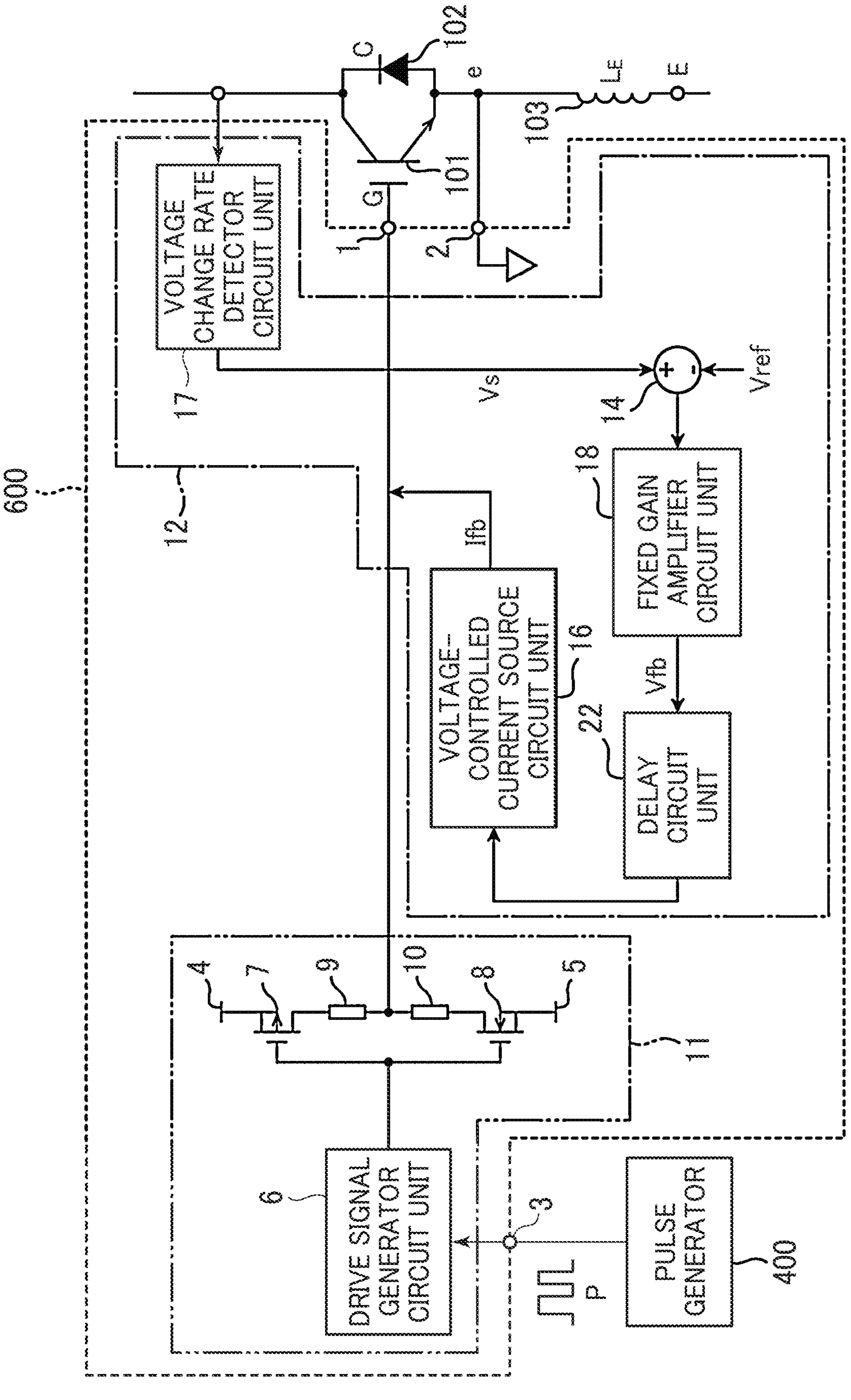
FIG. 17 is a basic circuit block diagram of a gate driving device of Conventional Example 3.

FIG. 17 is a block diagram of the basic circuit of a gate driving device 600 of Conventional Example 3. Conventional Example 3 is an example obtained by partially modifying the constitution described in Nonpatent Literature 1 to facilitate comparison with Example 2 of the present invention. The gate driving device 600 of Conventional Example 3 has a constitution similar to that of the gate driving device 600 of Example 2 shown in FIG. 16 except that the gain control circuit unit 21 is omitted and the variable gain amplifier circuit unit 15 is replaced by a fixed gain amplifier circuit unit 18. Difference from Example 2 will hereinafter be described.

The feedback current Ifb of the feedback current control unit 12 of Conventional Example 3 can be represented by the following equation.

$$Ifb(t+d) = G \times g \times (Vs(t) - Vref) \quad \text{Equation 10}$$

In the above equation, Vs(t) is a detection result of the voltage change rate detector circuit unit 17 at time t. Ifb(t+d) is a feedback current at time t+d. d is a circuit delay. G is a voltage gain of the fixed gain amplifier circuit unit 18 and g is an amplification factor of the voltage-controlled current source circuit unit 16. Vref is a referential voltage (its value is set at, for example, zero). Also in Conventional Example 3, the gain G and the amplification factor g are set to decrease the absolute value of the gate current Ig. This reduces the switching speed of the semiconductor switching element 101 and suppresses the surge voltage. However, since both G and g are fixed values also in Conventional Example 3, the feedback current Ifb cannot be adjusted according to the operation conditions of the semiconductor switching element 101.

Figure 18:
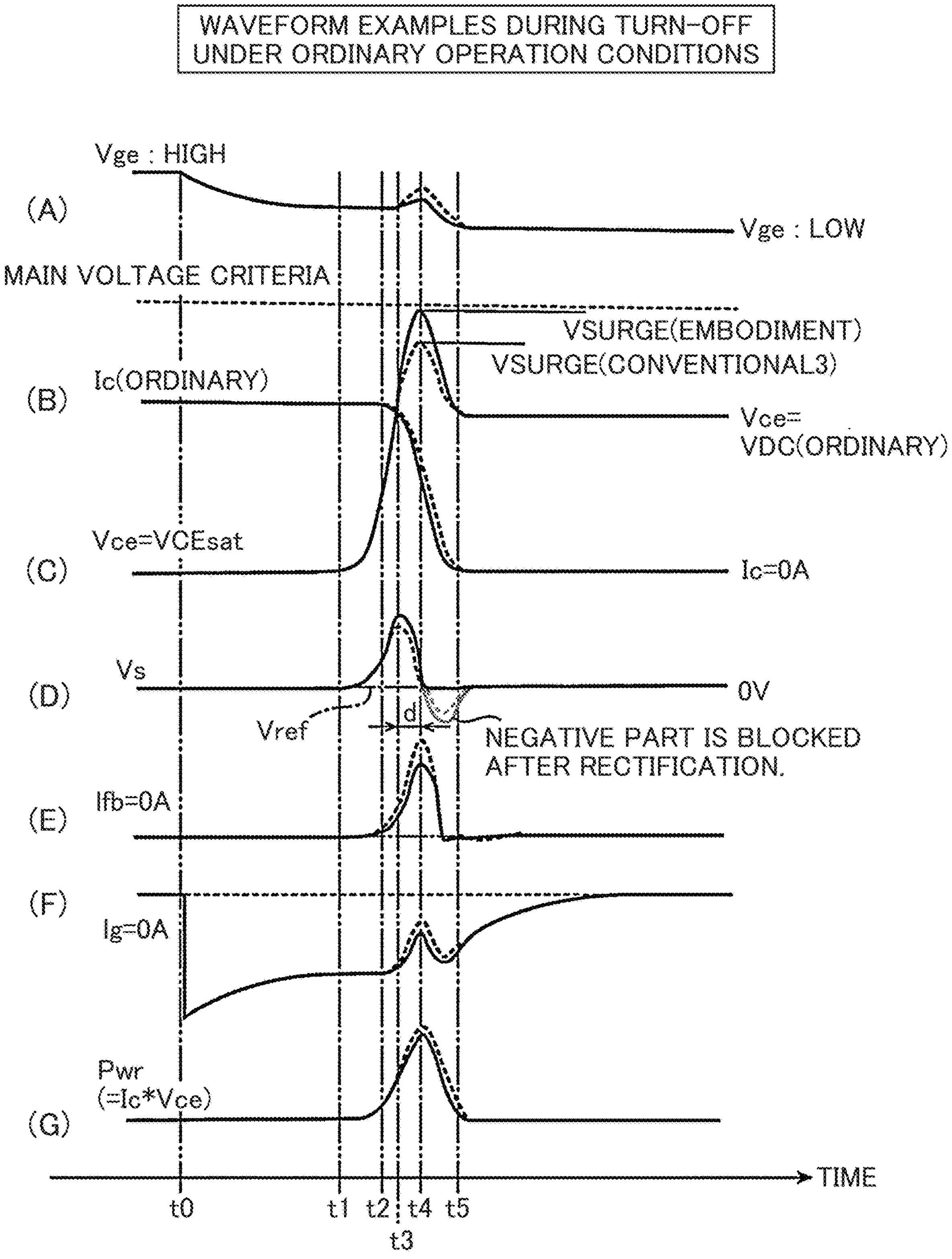
FIG. 18 is a view showing a waveform example of the semiconductor switching element of Example 2 during turn-off under ordinary operation conditions.

Each view of FIG. 18 shows one example of the waveform of the semiconductor switching element 101 during turn-off under ordinary operation conditions. The solid line in each view of FIG. 18 is a waveform of the gate driving device 600 of Example 2. The dotted line in each view of FIG. 18 is a waveform of the gate driving device 600 of Conventional Example 3 shown in FIG. 17.

FIG. 18(A) shows a gate-emitter voltage Vge of the semiconductor switching element 101 during turn-off. FIG. 18(B) shows a main current Ic that flows to the emitter E of the semiconductor switching element 101. FIG. 18(C) shows a main voltage Vce to be applied to between the collector C and the emitter E of the semiconductor switching element 101. FIG. 18(D) show the detection results Vs of the main voltage time change rate dVce/dt of the semiconductor switching element 101. FIG. 18(E) shows a feedback current Ifb formed by the feedback current control unit 12. FIG. 18(F) shows a gate current Ig to be applied to the gate G of the semiconductor switching element 101. FIG. 18(G) shows heat generation Pwr of the semiconductor switching element 101.

The operation of the semiconductor switching element 101 of Example 2 under ordinary conditions will be described specifically while referring to each view of FIG. 18. A description on the waveform similar to that shown in FIG. 8 is omitted.

The basic operation in FIG. 18 is similar to that in FIG. 8 except that they are different in the formation procedure of the feedback current Ifb during the period from time t1 to t5. During the period from time t1 to t5, the feedback current control unit 12 of Example 2 detects Vs as shown in FIG. 18(D). Here, as shown by Equation 9, a feedback current Ifb delayed by time d is formed according to the detection voltage Vs(t) at time t. The feedback current Ifb is shown in FIG. 18(E). The delay time d is preferably set at a difference t4–t3 between the surge voltage peak time t4 and the Vs peak time t3 to match the peak of the feedback current Ifb with the peak of the surge voltage.

Since the gain G of Conventional Example 3 is a fixed value, it is not adjusted according to the operation conditions and remains to be high as in the case under the worst conditions. As shown by the dotted line in FIG. 18(C), therefore, the surge voltage is excessively suppressed and drops more than necessary below the main voltage criteria. In short, the switching speed slows down excessively. As shown in FIG. 18(G), this enhances the heat generation Pwr and increases the turn-off loss.

On the other hand, since the gain G(s) of Example 2 can electrically be adjusted according to the operation conditions, the gain G(s) of Equation 8 can be made smaller than that in the case under the worst conditions. As shown in FIG. 18(E), this reduces the feedback current Ifb (solid line) of Example 2 compared to the feedback current Ifb (dotted line) of Conventional Example 3 and as shown in FIG. 18(F), reduces a decrease of the gate current absolute value of the present Example compared to that of Conventional Example 3.

This makes it possible to make the switching speed of the present Embodiment faster than that of Conventional Example 1 and reduce the heat generation Pwr as shown in FIG. 18(G). In short, this makes it possible to reduce the turn-off loss. By properly changing the gain G(s) of Example 2 according to the operation conditions, the switching speed can be adjusted to the extent that the surge voltage does not exceed the main voltage criteria.

Example 3

Figure 19:
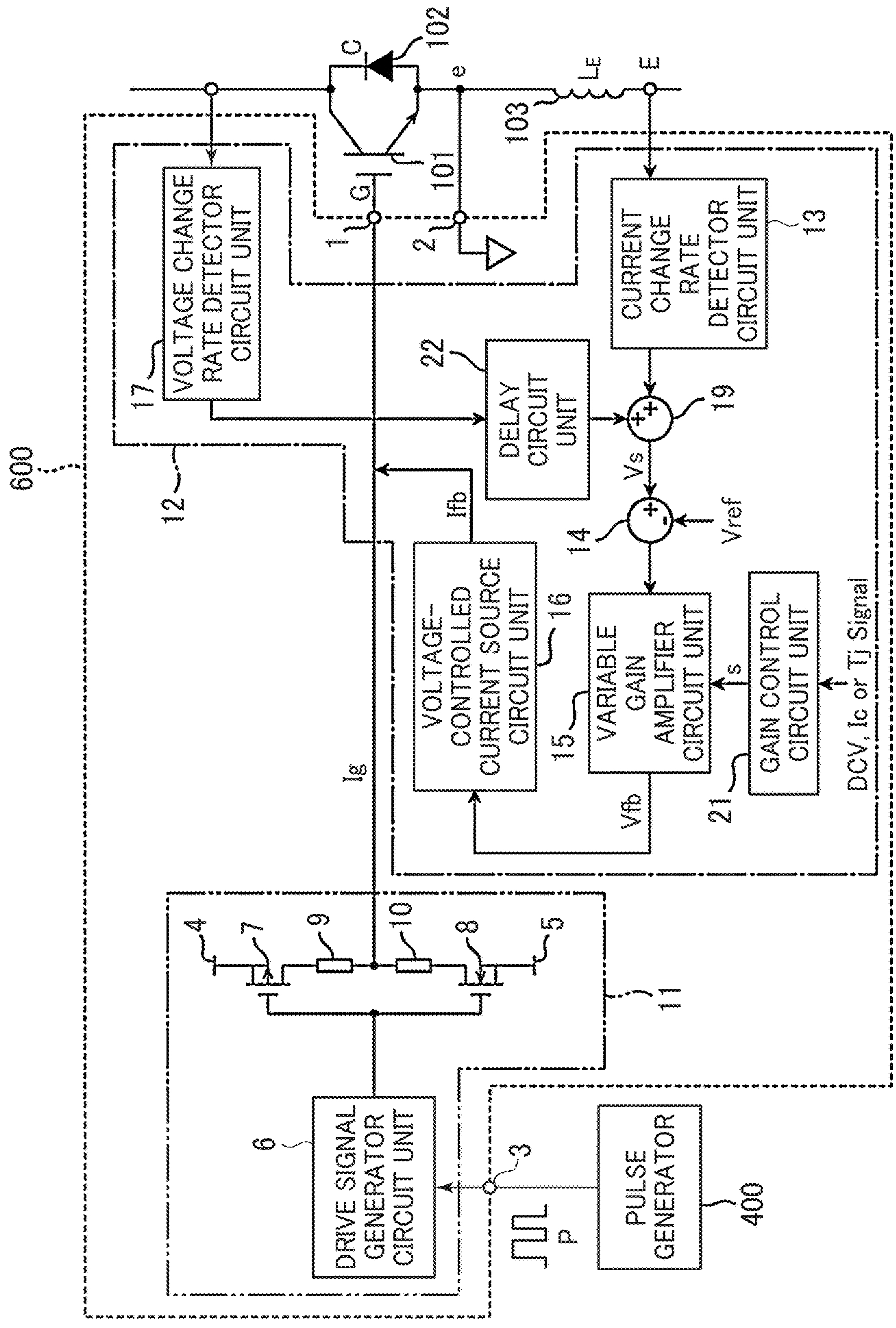
FIG. 19 is a basic circuit block diagram of a gate driving device of Example 3.

FIG. 19 is a block diagram of the basic circuit of a gate driving device 600 of Example 3. The gate driving device 600 of Example 3 has a constitution similar to that of the gate driving device 600 of Example 1 shown in FIG. 2 except that a voltage change rate detector circuit unit 17, an adder 19, and a delay circuit unit 22 are added to the feedback current control unit 12 of the gate driving device 600. In Example 3, compared to Example 1, portions until the formation of the detection results V(s) are mainly different. A difference from Example 1 will hereinafter be described. Here, the operation during turn-off will be described and the operation during turn-on is similar thereto.

The voltage change rate detector circuit unit 17 is composed of, for example, an RC differential circuit having a resistor and a condenser. The voltage change rate detector circuit unit 17 is connected to a collector terminal of the semiconductor switching element 101 and detects a time change rate of the main voltage Vce. The output terminal of the voltage change rate detector circuit unit 17 is connected to the delay circuit unit 22. The output terminal of the delay circuit unit 22 is connected to the adder 19. The delay circuit unit 22 adds a delay d to a detection signal received from the voltage change rate detector circuit unit 17 and outputs the result to the adder 19. It is to be noted that when an adequate delay d can be ensured in a circuit constitution, the delay circuit unit 22 may be omitted. The current change rate detector circuit unit 13 detects a time change rate of the main current Ic and outputs the detection signal to the adder 19.

The adder 19 adds the voltage change rate detection signal and the current change rate detection signal to form a detection voltage Vs(t). The Vs(t) can be represented by the following equation.

$$Vs(t) = \left(Rc \times dv/dt(t-d) - Ls \times dIc/dt(t)\right) \qquad \text{Equation 11}$$

In the above equation, dv/dt(t–d) is a main voltage time change rate of the semiconductor switching element 101 at time t–d and dIc/dt(t) is a main current time change rate of the semiconductor switching element 101 at time t. RC is a time constant of the differential circuit of the voltage change rate detector circuit unit 17.

The constitution and operation of the feedback current control unit 12 of Example 3 after the formation of V(s) are similar to those of Example 1 so that they will be described simply.

As in Example 1, the feedback current Ifb can be represented by the following equation.

$$Ifb(t) = G(s) \times g \times (Vs(t) - Vref) \qquad \text{Equation 12}$$

In the above equation, Vs(t) is a detection voltage at time t output from the adder 19. G(s) is a voltage gain of the variable gain amplifier circuit unit 15 and g is an amplification factor of the voltage-controlled current source circuit unit 16. Vref is a reference voltage. The value of Vref is, for example, zero. G(s) is adjusted according to s. g is a fixed value. It is to be noted that the amplification factor g may be replaced by g(s) which can be adjusted according to the value of the gain control signal s or the gain G(s) may be replaced by a fixed value G.

As in Example 1, the feedback current Ifb can reduce the absolute value of the gate current Ig of the semiconductor switching element 101. This reduces the switching speed of the semiconductor switching element 101 and suppresses the surge voltage. The method of adjusting the gain in Example 3 is similar to that in Example 1. The feedback current Ifb can therefore be changed flexibly by adjusting the gain G(s) according to the operation conditions of the semiconductor switching element 101. Even in Example 3, this makes it possible to reduce the switching loss while adjusting the suppression amount of the surge voltage according to the operation conditions of the semiconductor switching element 101.

It is to be noted that in the aforesaid Examples and Modification Examples, placement of the variable gain amplifier circuit unit 15 independently of another circuit unit was described, but it may be placed inside the subtractor 14, the voltage-controlled current source circuit unit 16, or the electricity change rate detector circuit unit 13 (or 17). The gate driving circuit unit 11 may be a current source driving circuit unit. The mask circuit unit 20 used in Modification Example of Example 1 may be added similarly to Example 2 or Example 3. In Example 2, the position of the delay circuit unit 22 may be changed to a position between the variable gain amplifier circuit unit 15 and the subtractor 14 or to a position between the subtractor 14 and the electricity change rate detector circuit unit 17. According to the description in the aforesaid Example, the gain G(s) of the variable gain amplifier circuit unit is changed successively, but it may be changed step by step or discretely by using one or a plurality of threshold values.

The aforesaid Examples of the present invention have the following effects and advantages.

(1) A driving device of a semiconductor switching element of one Example of the present invention has a gate driving circuit unit that drives the semiconductor switching element and a feedback current control unit that applies, to a gate of the semiconductor switching element, a feedback current calculated by multiplying a change rate of electricity to be applied to the semiconductor switching element by the gate driving circuit unit, by a predetermined gain, in which the change rate of electricity is a time change rate of at least one of a voltage or a current to be applied to the semiconductor switching element and the feedback current control unit adjusts a surge voltage of the semiconductor switching element by changing the gain according to the operation conditions of the semiconductor switching element.

The aforesaid constitution makes it possible to adjust the surge voltage not to exceed the withstand voltage of the element because a feedback current is formed and the surge voltage is adjusted according to the operation conditions of the semiconductor switching element. Further, even under the changed operation conditions, by adjusting the gain and thereby adjusting the feedback current, reduction in switching loss can also be suppressed without excessively suppressing the surge voltage.

(2) The feedback current control unit has an electricity change rate detector circuit unit that detects a change rate of electricity, a gain control circuit unit that forms a gain control signal based on operation conditions, a variable gain amplifier circuit unit that calculates a gain based on the gain control signal and multiplies the change rate of electricity by the gain, and a voltage-controlled current source circuit unit that converts the output from the variable gain amplifier circuit unit to a feedback current. This makes it possible to realize the effect and advantage of (1) by using various circuit constitutions.

(3) The variable gain amplifier circuit unit sets main voltage criteria obtained by subtracting a predetermined design margin from a rated voltage of the semiconductor switching element as the maximum value of the surge voltage and when the operation conditions are in a range where the surge voltage exceeds the main voltage criteria, it monotonously increases the gain according to an increase in surge voltage. This makes it possible to prevent the element from being destroyed by the surge voltage exceeding the main voltage criteria and at the same time, to prevent excessive suppression of the surge voltage.

(4) The variable gain amplifier circuit unit makes the gain zero when the operation conditions are in a region where the surge voltage is the main voltage criteria or less. As in (3), this makes it possible to prevent excessive suppression of the surge voltage.

(5) The variable gain amplifier circuit unit is composed of a voltage-controlled amplifier circuit. The voltage-controlled amplifier circuit is composed of a voltage-controlled resistor. This makes it possible to successively calculate the gain according to an input voltage.

(6) The operation condition is a bus voltage to be applied to the semiconductor switching element and the maximum value of the bus voltage is within 50 to 80% of the rated voltage of the semiconductor switching element. In addition, the operation condition is a main current to be applied to the semiconductor switching element and the maximum value of the main current is within 1 to 2 times the rated current in the semiconductor switching element. Further, the operation condition is a junction temperature of the semiconductor switching element and the range of the junction temperature is a range of a rated junction temperature in the semiconductor switching element. Thus, by setting the operation conditions at these experimentally found values, the advantages of the present invention can be realized more preferably.

(7) The gain has a dead zone region when the bus voltage is a boundary voltage or less; it has a monotonously increasing region when the bus voltage is a boundary voltage or more; and the boundary voltage is a value within a range of 30 to 50% of the rated voltage. The gain has a dead zone region when the main current is a boundary current or less, it has a monotonously increasing region when the main current is a boundary current or more; and the boundary current is a value within a range of 20 to 80% of the rated current. As in (6), this makes it possible to more preferably realize the advantage of the present invention by using the experimentally found values for the gain adjusting method.

(8) The feedback current control unit monotonously decreases the absolute value of the gain according to an increase in the junction temperature of the semiconductor switching element. This makes it possible to adjust the magnitude of the feedback current to correspond to the surge voltage that decreases according to an increase in junction temperature.

(9) The main voltage criteria are values within a range of 70 to 90% of the rated voltage. This makes it possible to appropriately setting the maximum value of the permissible surge voltage while comparing it to the withstand voltage or the like of the element.

(10) A power conversion device of one Example of the present invention has the aforesaid driving device of semiconductor switching element and a plurality of semiconductor switching elements. The power conversion device realized by the above constitution can exhibit the aforesaid effects and advantages preferably.

The technical scope of the present invention is not limited to the scope described in the aforesaid embodiment and the present invention includes various modification examples without departing from the main characteristics of the present invention. Therefore, the aforesaid Examples are only examples and should not be construed as limiting. Moreover, a portion of the constitution of each Example may be modified by addition of another constitution, deletion, or replacement with another constitution and such modified ones are all embraced in the scope of the present invention.

LIST OF REFERENCE SIGNS

- 11 . . . gate driving circuit unit
- 12 . . . feedback current control unit
- 13 . . . electricity change rate detector circuit unit (current change rate detector circuit unit)
- 15 . . . variable gain amplifier circuit unit
- 16 . . . voltage-controlled current source circuit unit
- 17 . . . electricity change rate detector circuit unit (voltage change rate detector circuit unit)
- 21 . . . gain control circuit unit
- 101 . . . semiconductor switching element
- 600 . . . gate driving device (driving device of a semiconductor switching element 101)

The invention claimed is:

1. A driving device of semiconductor switching element, comprising:

a gate driving circuit unit that drives a semiconductor switching element and a feedback current control unit that applies a feedback current, which is calculated by multiplying a change rate of electricity to be applied by the gate driving circuit unit to the semiconductor switching element by a predetermined gain, to a gate of the semiconductor switching element, wherein the change rate of electricity is a time change rate of at least one of a voltage or a current to be applied to the semiconductor switching element, and the feedback current control unit changes the gain according to an operation condition of the semiconductor switching element to adjust a surge voltage of the semiconductor switching element, wherein the feedback current control unit comprises:

an electricity change rate detector circuit unit that detects the change rate of electricity, a gain control circuit unit that forms a gain control signal based on the operation condition, a variable gain amplifier circuit unit that calculates the gain based on the gain control signal and multiplies the change rate of electricity by the gain, and a voltage-controlled current source circuit unit that converts an output from the variable gain amplifier circuit unit to the feedback current, wherein the variable gain amplifier circuit unit sets main voltage criteria obtained by subtracting a predetermined design margin from a rated voltage of the semiconductor switching element, and wherein the variable gain amplifier circuit unit sets the gain at zero when the operation condition is such that the surge voltage is in a region within the main voltage criteria or less.

2. The driving device of semiconductor switching element according to claim 1, wherein the variable gain amplifier circuit unit sets, as a maximum value of the surge voltage, main voltage criteria obtained by subtracting a predetermined design margin from a rated voltage of the semiconductor switching element, and the variable gain amplifier circuit unit monotonously increases the gain according to an increase in the surge voltage when the operation condition is such that the surge voltage is in a region exceeding the main voltage criteria.

3. The driving device of semiconductor switching element according to claim 2, wherein the main voltage criteria are values ranging from 70% to 90% of the rated voltage.

4. The driving device of semiconductor switching element according to claim 1, wherein the variable gain amplifier circuit unit has a voltage-controlled amplifier circuit.

5. The driving device of semiconductor switching element according to claim 4, wherein the voltage-controlled amplifier circuit has a voltage-controlled resistor.

6. The driving device of semiconductor switching element according to claim 1, wherein the operation condition is a bus voltage to be applied to the semiconductor switching element and a maximum value of the bus voltage is a value ranging from 50 to 80% of the rated voltage of the semiconductor switching element.

7. The driving device of semiconductor switching element according to claim 6, wherein the gain is in a dead zone region when the bus voltage is a boundary voltage or less and in a monotonously increasing region when the bus voltage is the boundary voltage or more, and the boundary voltage is a value ranging from 30 to 50% of the rated voltage.

8. The driving device of semiconductor switching element according to claim 1, wherein the operation condition is a main current to be applied to the semiconductor switching element and a maximum value of the main current is a value ranging from 1 to 2 times a rated continuous current of the semiconductor switching element as specified in a manufacturer datasheet.

9. The driving device of semiconductor switching element according to claim 8, wherein the gain is in a dead zone region when the main current is a boundary current or less and in a monotonously increasing region when the main current is the boundary current or more, and the boundary current is a value ranging from 20 to 80% of the rated continuous current of the semiconductor switching element as specified in the manufacturer datasheet.

10. The driving device of semiconductor switching element according to claim 1, wherein the operation condition is a junction temperature of the semiconductor switching element and the junction temperature is within a range of a rated junction temperature of the semiconductor switching element.

11. The driving device of semiconductor switching element according to claim 10, wherein the feedback current control unit monotonously decreases an absolute value of the gain according to an increase in junction temperature of the semiconductor switching element.

12. A power conversion device, comprising:

the device of semiconductor switching element as claimed in claim 1 and a plurality of the semiconductor switching elements.

13. A driving device of semiconductor switching element, comprising:

a gate driving circuit unit that drives a semiconductor switching element and a feedback current control unit that applies a feedback current, which is calculated by multiplying a change rate of electricity to be applied by the gate driving circuit unit to the semiconductor switching element by a predetermined gain, to a gate of the semiconductor switching element, wherein the change rate of electricity is a time change rate of at least one of a voltage or a current to be applied to the semiconductor switching element, and the feedback current control unit changes the gain according to an operation condition of the semiconductor switching element to adjust a surge voltage of the semiconductor switching element, wherein the feedback current control unit comprises:

an electricity change rate detector circuit unit that detects the change rate of electricity, a gain control circuit unit that forms a gain control signal based on the operation condition, a variable gain amplifier circuit unit that calculates the gain based on the gain control signal and multiplies the change rate of electricity by the gain, and a voltage-controlled current source circuit unit that converts an output from the variable gain amplifier circuit unit to the feedback current.

14. The driving device of semiconductor switching element according to claim 13, wherein the variable gain amplifier circuit unit sets, as a maximum value of the surge voltage, main voltage criteria obtained by subtracting a predetermined design margin from a rated voltage of the semiconductor switching element, and the variable gain amplifier circuit unit monotonously increases the gain according to an increase in the surge voltage when the operation condition is such that the surge voltage is in a region exceeding the main voltage criteria.

15. The driving device of semiconductor switching element according to claim 13, wherein the variable gain amplifier circuit unit has a voltage-controlled amplifier circuit.

16. The driving device of semiconductor switching element according to claim 15, wherein the voltage-controlled amplifier circuit has a voltage-controlled resistor.

17. The driving device of semiconductor switching element according to claim 13, wherein the operation condition is a bus voltage to be applied to the semiconductor switching element and a maximum value of the bus voltage is a value ranging from 50 to 80% of the rated voltage of the semiconductor switching element.

18. The driving device of semiconductor switching element according to claim 13, wherein the operation condition is a main current to be applied to the semiconductor switching element and a maximum value of the main current is a value ranging from 1 to 2 times a rated continuous current of the semiconductor switching element as specified in a manufacturer datasheet.

19. The driving device of semiconductor switching element according to claim 13, wherein the operation condition is a junction temperature of the semiconductor switching element and the junction temperature is within a range of a rated junction temperature of the semiconductor switching element.

20. A driving device of semiconductor switching element, comprising:

a gate driving circuit unit that drives a semiconductor switching element and a feedback current control unit that applies a feedback current, which is calculated by multiplying a change rate of electricity to be applied by the gate driving circuit unit to the semiconductor switching element by a predetermined gain, to a gate of the semiconductor switching element, wherein the change rate of electricity is a time change rate of at least one of a voltage or a current to be applied to the semiconductor switching element, and the feedback current control unit changes the gain according to an operation condition of the semiconductor switching element to adjust a surge voltage of the semiconductor switching element, wherein the operation condition is a junction temperature of the semiconductor switching element and the junction temperature is within a range of a rated junction temperature of the semiconductor switching element, and the feedback current control unit monotonously decreases an absolute value of the gain according to an increase in junction temperature of the semiconductor switching element.

* * * * *